US007337100B1

(12) United States Patent
Hutton et al.

(10) Patent No.: US 7,337,100 B1
(45) Date of Patent: Feb. 26, 2008

(54) PHYSICAL RESYNTHESIS OF A LOGIC DESIGN

(75) Inventors: Michael D. Hutton, Mountain View, CA (US); Joachim Pistorius, Milpitas, CA (US); Babette van Antwerpen, Mountain View, CA (US); Gregg Baeckler, San Jose, CA (US); Richard Yuan, Cupertino, CA (US); Yean-Yow Hwang, Palo Alto, CA (US)

(73) Assignee: Altera Corporation, San Jose, CA (US)

( * ) Notice: Subject to any disclaimer, the term of this patent is extended or adjusted under 35 U.S.C. 154(b) by 537 days.

(21) Appl. No.: 10/461,921

(22) Filed: Jun. 12, 2003

(51) Int. Cl.
*G06F 17/50* (2006.01)
*G06F 9/455* (2006.01)
*G01R 31/28* (2006.01)

(52) U.S. Cl. .............................. 703/13; 703/14; 703/23; 716/1; 716/5; 716/7; 716/18; 714/726; 395/500

(58) Field of Classification Search .................. 703/13, 703/23, 14; 716/1, 5, 7, 18; 395/500; 714/726
See application file for complete search history.

(56) References Cited

U.S. PATENT DOCUMENTS

| | | | | |
|---|---|---|---|---|
| 5,210,700 | A * | 5/1993 | Tom ............................... | 716/6 |
| 5,493,508 | A * | 2/1996 | Dangelo et al. ............... | 716/5 |
| 5,572,437 | A * | 11/1996 | Rostoker et al. .............. | 716/18 |
| 5,801,958 | A * | 9/1998 | Dangelo et al. ............... | 716/18 |
| 5,880,971 | A * | 3/1999 | Dangelo et al. ............... | 716/6 |
| 5,956,256 | A * | 9/1999 | Rezek et al. ................... | 716/3 |
| 6,289,498 | B1 * | 9/2001 | Dupenloup .................... | 716/18 |
| 6,539,536 | B1 * | 3/2003 | Singh et al. ................... | 716/18 |
| 6,663,648 | B1 * | 12/2003 | Trotta ........................... | 606/194 |
| 6,668,364 | B2 * | 12/2003 | McElvain et al. .............. | 716/7 |

OTHER PUBLICATIONS

Cong et al. 'On Area/Depth Trade-off in LUT-Based Technology Mapping'. Design Automation 1993, 30th Conference, Jun. 1993, pp. 213-218.*

(Continued)

*Primary Examiner*—Kamini Shah
*Assistant Examiner*—Shambhavi Patel
(74) *Attorney, Agent, or Firm*—Townsend and Townsend and Crew LLP

(57) ABSTRACT

A multiple-pass synthesis technique improves the performance of a design. In a specific embodiment, synthesis is performed in two or more passes. In a first pass, a first synthesis is performed, and in a second or subsequent pass, a second synthesis or resynthesis is performed. During the first synthesis, the logic will be mapped to for example, the logic structures (e.g., logic elements, LUTs, synthesis gates) of the target technology such as a programmable logic device. Alternatively a netlist may be provided from a third party. Before the second synthesis, a fast or abbreviated fit may be performed of the netlist to a specific device (e.g., specific programmable logic device product). Before the second synthesis, the netlist obtained from the first synthesis (or provided by a third party) is unmapped and then the second synthesis is performed. Since a partial fit is performed, the second synthesis has more visibility and optimize the logic better than by using a single synthesis pass. After the second synthesis pass, a more detailed fit is performed.

39 Claims, 15 Drawing Sheets

OTHER PUBLICATIONS

Stenz et al. 'Performance Optimization by Interacting Netlist Transformations and Placement'. IEEE Transactions on Computer-Aided Design of Integrated Circuits and Systems. vol. 19, No. 3. Mar. 2000.*

Cong et al. 'On Area/Depth Trade-off in LUT-Based Technology Mapping'. Design Automation 1993, 30th Conference. Jun. 1993, pp. 213-218.*

Stenz et al. 'Performance Optimization by Interacting Netlist Transformations and Placement'. IEEE Transactions on Computer-Aided Design of Integrated Circuits and Systems. vol. 19, No. 3. Mar. 2000.*

Cong et al. 'On Area/Depth Trade-off in LUT-Based Technology Mapping'. Design Automation 1993. 30th Conference. Jun. 1993, pp. 213-218.*

L. Benini, P. Vuillod, G. De Micheli, "Iterative Remapping for Logic Circuits," IEEE Transactions on Computer-Aided Design of Integrated Circuits and Systems, 17 (10), pp. 948-964, Oct. 1998.

Cong, J. and Y. Ding, "FlowMap: An Optimal Technology Mapping Algorithm for Delay Optimization in Lookup-Table Based FPGA Designs," IEEE Transactions on Computer-Aided Design, vol. 13, No. 1, pp. 1-12, Jan. 1994.

Cong, J. and Y.-Y. Hwang, "Simultaneous Depth and Area Minimization in LUT-based FPGA Mapping," Proc. ACM International Symposium on Field Programmable Gate Arrays, pp. 68-74, Feb. 1995.

W. Gosti, S.P. Khatri, A.L. Sangiovanni-Vincentelli, "Addressing the Timing Closure Problem by Integrating Logic Optimization and Placement," ACM/IEEE International Conference on Computer-Aided Design (ICCAD 2001), pp. 224-231, Nov. 5-8, 2001.

D. Kim, J. Jung, S. Lee, J. Jeon, K. Choi, "Behavior-to-Placed RTL Synthesis with Performance-Driven Placement," ACM/IEEE International Conference on Computer-Aided Design (ICCAD 2001), pp. 320-326, Nov. 5-8, 2001.

V.N. Kravets, K.A. Sakallah, "Resynthesis of Multi-Level Circuits Under Tight Constraints Using Symbolic Optimization," ACM/IEEE International Conference on Computer-Aided Design (ICCAD 2002), pp. 687-693, Nov. 10-14, 2002.

B. Kumthekar, F. Somenzi, "Power and Delay Reduction via Simultaneous Logic and Placement Optimization in FPGAs," ACM Design, Automation and Test in Europe Conference (Date 2000), pp. 202-207, Mar. 27-30, 2000.

J.Y. Lin, A. Jagannathan, J. Cong, "Placement-Driven Technology Mapping for LUT-Based FPGAs," 11th ACM International Symposium on Field Programmable Gate Arrays (FPGA 2003), pp. 121-126, Feb. 23-25, 2003.

D.P. Singh, S.D. Brown, "Integrated Retiming and Placement for Field Programmable Gate Arrays," 10th ACM International Symposium on Field Programmable Gate Arrays (FPGA 2002), pp. 67-76, Feb. 24-26, 2002.

G. Stenz, B.M. Riess, B. Rohfleisch, F.M. Johannes, "Performance Optimization of Interacting Netlist Transformations and Placement," IEEE Transactions on Computer-Aided Design of Integrated Circuits and Systems, 19 (3), pp. 350-358, Mar. 2000.

* cited by examiner

Example of a Computer-Aided Design Flow

PHYSICAL RESYNTHESIS OF A LOGIC DESIGN

COPYRIGHT NOTICE

A portion of the disclosure of this patent document contains material which is subject to copyright protection. The copyright owner has no objection to the facsimile reproduction by anyone of the patent document or the patent disclosure, as it appears in the U.S. Patent and Trademark Office patent file or records, but otherwise reserves all copyright rights whatsoever.

BACKGROUND OF THE INVENTION

The present invention relates to the area of electronic design automation of logic designs and in particular, to an aspect known as physical resynthesis of a logic design, especially using place and route timing delays to improve synthesis results.

Integrated circuits are important building blocks of the modern age. Technology continues to evolve and integrated circuits continue to provide improved functionality. As integrated circuits improve, so do the electronics systems that are built using integrated circuits. There are many types of integrated circuits such as memories, microprocessors, application specific integrated circuits (ASICs), and programmable logic. Programmable logic integrated circuits such as PALs, PLDs, FPGAs, LCAs, and others are becoming more complex and continually evolving to provide more user-programmable features on a single integrated circuit. Modern programmable logic integrated circuits incorporate programmable logic including logic gates, products terms, or look-up tables. Programmable logic integrated circuits also included embedded functionality such as user-programmable memory or RAM, digital signal processors (DSPs), and on-board microcontrollers such as ARM-based or MIPS-based controllers.

As integrated circuits become more complex and provide more functionality in a smaller die size, it also becomes increasing difficult to ensure the logic functions are implemented properly and in an optimal way. Modern digital integrated circuits have many transistors and many logic gates, more so than be optimized manually in a reasonable amount of time, especially when time-to-market is critical in ensuring a product's success. As a specific example, a typical programmable logic design surpasses the multimillion-gate mark.

Electronic design automation tools are available to assist engineers with the design and verification tasks. But even with the help of computer-aided tools, the process of optimizing an integrated circuit design can be time-consuming because of the large number of variables involved. It is desirable that the design automation task is done time efficiently even for large designs. Further, it is desirable the design automation tool maximizes performance or otherwise improve an aspect of an integrated circuit design. Some other aspects of a design that a tool may help with include improving critical path performance, removing metastability, reducing the number of logic gates used, checking or verifying functionality, removing race conditions, and others.

Some specific performance measures in a design are propagation delay and fmax or FMAX, which is the maximum clock frequency which the integrated circuit can operate before logic errors will occur. For example, it is desirable to optimize logic in a design to provide the highest fmax frequency possible. When improving the performance, it is important the same or equivalent functionality is provided as the original logic design, metastability is not introduced into the design, and the improved design is logically legal.

As can be appreciated, there is a need to provide an electronic design automation system to evaluate and then improve the performance of an integrated circuit design. This system may be specially suited to handling programmable logic designs.

SUMMARY OF THE INVENTION

A multiple-pass synthesis technique improves the performance of a design. In a specific embodiment, synthesis is performed in two or more passes. In a first pass, a first synthesis is performed, and in a second or subsequent pass, a second synthesis or resynthesis is performed. During the first synthesis, the logic will be mapped to for example, the logic structures (e.g., logic elements, LUTs, synthesis gates) of the target technology such as a programmable logic device. Alternatively a netlist may be provided from a third party. Before the second synthesis, a fast or abbreviated fit may be performed of the netlist to a specific device (e.g., specific programmable logic device product). Before the second synthesis, the netlist obtained from the first synthesis (or provided by a third party) is unmapped and then the second synthesis is performed. Since a partial fit is performed, the second synthesis has more visibility and optimize the logic better than by using a single synthesis pass. The logic may be optimized based on timing (e.g., minimize timing delays like propagation delay or clock-to-output) or area (e.g., improve overall utilization of LUT blocks or of the functionality on the integrated circuit). After the second synthesis pass, a more detailed fit is performed.

A further aspect of the invention is a statistics-based technology mapping. In an embodiment, statistics-based delays for wire and cells are stored in a table, and then these are looked-up and used to determine delays of paths within the design. These statistics-based delays improve the estimation of performance, and therefore, in conjunction with the multiple-pass synthesis approach provides more performance improvements when implementing the design in an integrated circuit, such as a programmable logic integrated circuit.

An aspect of the invention includes implementing a logic design in an integrated circuit by performing a number of synthesis steps. Multiple synthesis operations are performed in a design flow. In a specific embodiment, synthesis is performed in two passes. In a first pass, synthesis is performed, and in a second pass, resynthesis is performed.

In a specific implementation, during the first pass, a logic design is mapped into logic structures, such as the logic elements and look-up tables of a programmable logic device. And during the second pass, before resynthesis, the logic design is unmapped back into the logic design. Timing delays determined during a place and route step of the first pass are used to improve synthesis results during a second pass. The synthesis may include Shannon decomposition to improve performance of the logic, especially the critical path. See C. E. Shannon: "The Synthesis of Two-Terminal Switching Circuits", *In the Bell System Technical Journal*, Vol. 28, pp. 59-98, 1949.

Moreover, in a specific implementation, during the first pass, a fast or abbreviated placement or fit (e.g., place and route step) of the logic is performed. This improves execution speed of the technique of the invention since a complete placement or fit is not needed at this point. During the second pass, a complete placement will be performed. The user may have an option to specify whether to optimize for speed or area. For example, if it is desirable to optimize speed over area, greater numbers of logic structures may be used in order improve the performance. If it is desirable to optimize for area over speed (such as to fit a large design into a particular PLD), then the number of logic structures will be minimized.

Furthermore, information may be saved during the first pass and used in the second pass. For example, some information that may be saved between passes may include timing information, placed locations, metrics of congestion, and criticality among others.

According to an aspect, the invention includes a method including: providing a high-level design language representation of an integrated circuit design; executing a first design synthesis process on the high-level design language representation of the integrated circuit design to obtain a first netlist for the integrated circuit design; unmapping the first netlist to obtain a gate-level representation of the first netlist; and executing a second design synthesis process on the gate-level representation of the first netlist to obtain a second netlist.

According to another aspect, the invention includes a method including: providing a high-level design language representation of an integrated circuit design; providing a first netlist for the integrated circuit design obtained by executing a first design synthesis process on the high-level design language representation of the integrated circuit design; unmapping the first netlist to obtain a gate-level representation of the first netlist; and executing a second design synthesis process on the gate-level representation of the first netlist to obtain a second netlist.

Other objects, features, and advantages of the present invention will become apparent upon consideration of the following detailed description and the accompanying drawings, in which like reference designations represent like features throughout the figures.

DETAILED DESCRIPTION OF THE INVENTION

Computer Aided Design System with Resynthesis

Figure 1A:
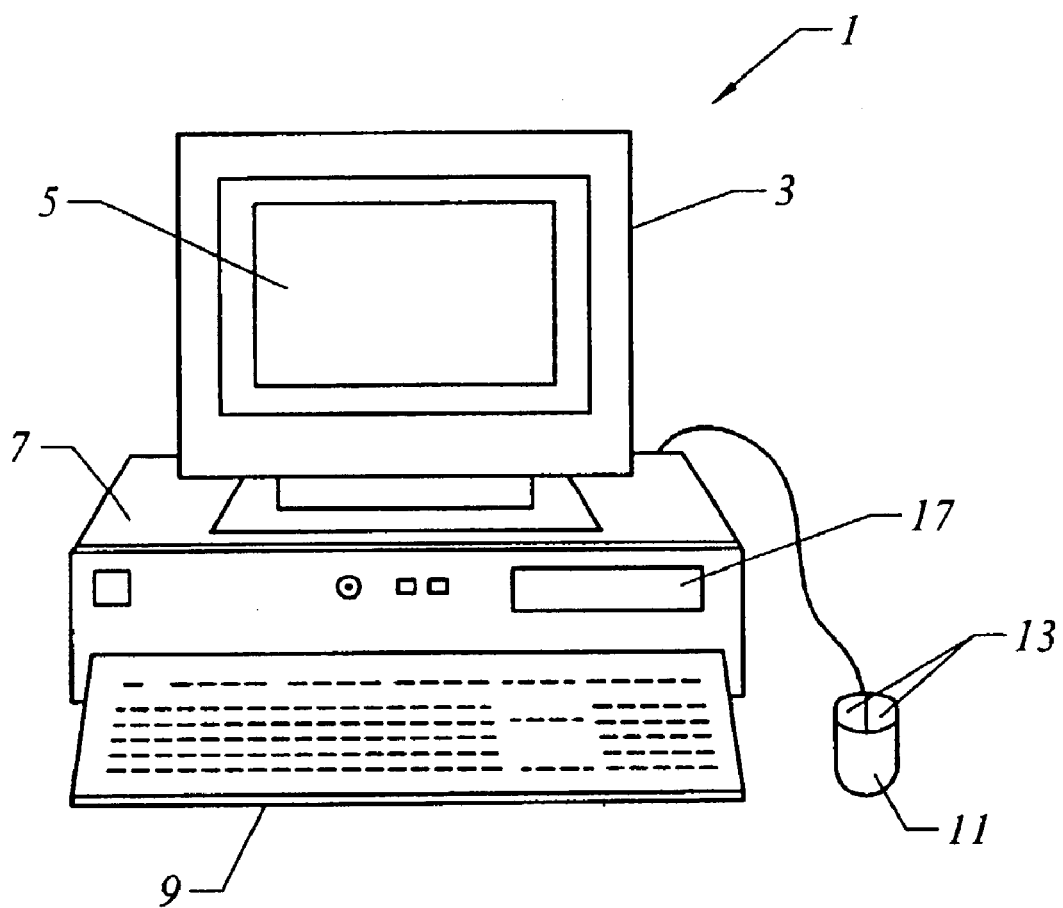
FIG. 1A shows an embodiment of a system of the invention.

FIG. 1A shows a system of the present invention for performing physical resynthesis. In an embodiment, software of the invention executes on a computer workstation system, such as shown in FIG. 1A. FIG. 1A shows a computer system 1 that includes a monitor 3, screen 5, cabinet 7, keyboard 9, and mouse 11. Mouse 11 may have one or more buttons such as mouse buttons 13. Cabinet 07 houses familiar computer components, some of which are not shown, such as a processor, memory, mass storage devices 17, and the like. Mass storage devices 17 may include mass disk drives, floppy disks, Iomega ZIP™ disks, magnetic disks, fixed disks, hard disks, CD-ROMs, recordable CDs, DVDs, DVD-R, DVD-RW, Flash and other non-volatile solid-state storage, tape storage, reader, and other similar media, and combinations of these. A binary, machine-executable version, of the software of the present invention may be stored or reside on mass storage devices 17. Furthermore, the source code of the software of the present invention may also be stored or reside on mass storage devices 17 (e.g., magnetic disk, tape, or CD-ROM).

Figure 1B:
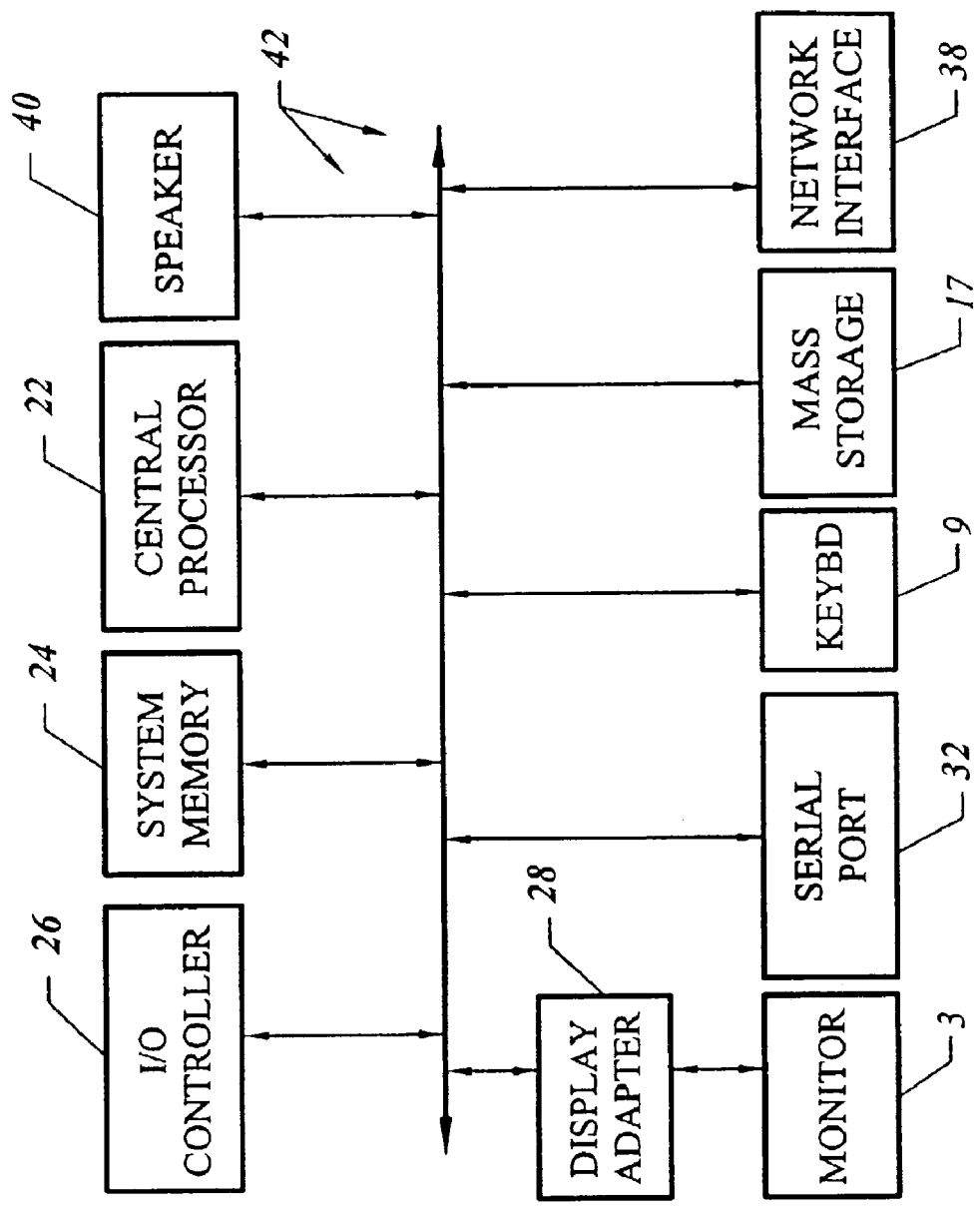
FIG. 1B shows a more detailed block diagram of the system of FIG. 1A.

Furthermore, FIG. 1B shows a system block diagram of computer system 1 used to execute the software of the present invention. As in FIG. 1A, computer system 1 includes monitor 3, keyboard 9, and mass storage devices 17. Computer system 1 further includes subsystems such as central processor 22, system memory 24, input/output (I/O) controller 26, display adapter 28, serial or universal serial bus (USB) port 32, network interface 38, and speaker 40. The invention may also be used with computer systems with additional or fewer subsystems. For example, a computer system could include more than one processor 22 (i.e., a multiprocessor system) or a system may include a cache memory.

Arrows such as 42 represent the system bus architecture of computer system 1. However, these arrows are illustrative of any interconnection scheme serving to link the subsystems. For example, speaker 40 could be connected to the other subsystems through a port or have an internal direct connection to central processor 22. Computer system 1 shown in FIG. 1A is but an example of a computer system suitable for use with the present invention. Other configurations of subsystems suitable for use with the present invention will be readily apparent to one of ordinary skill in the art.

Computer software products may be written in any of various suitable programming languages, such as C, C++, Pascal, Fortran, Perl, MatLab (from MathWorks, www-.mathworks.com), SAS, SPSS, and Java. The computer software product may be an independent application with data input and data display modules. Alternatively, the computer software products may be classes that may be instantiated as distributed objects. The computer software products may also be component software such as Java Beans (from Sun Microsystem), Enterprise Java Beans (EJB from Sun Microsystems). An operating system for the system may be one of the Microsoft Windows® family of operating systems (e.g., Windows 95, 98, Me, Windows NT, Windows 2000, Windows XP), Linux, UNIX, or Sun OS. Other operating systems may be used.

Furthermore, the computer may be connected to a network and may interface to other computers using this network. For example, pattern recognition may be performed via distributed computer through this network, where each computer in the network performs part of the task of the many series of pattern recognition steps in parallel. Furthermore, the network may be an intranet, internet, or the Internet, among others. The network may be a wired network (e.g., using copper), telephone network, packet network, an optical network, or a wireless network. For example, data and other information may be passed between the computer and components (or steps) of a system of the invention using a wireless network using a protocol such as Wi-Fi (IEEE standard 802.11, 802.11a, 802.11b, 802.11g, and 802.11i to name a few examples). For example, signals from a computer may be transferred, at least in part, wirelessly to a programmable logic integrated circuit.

Figure 1C:
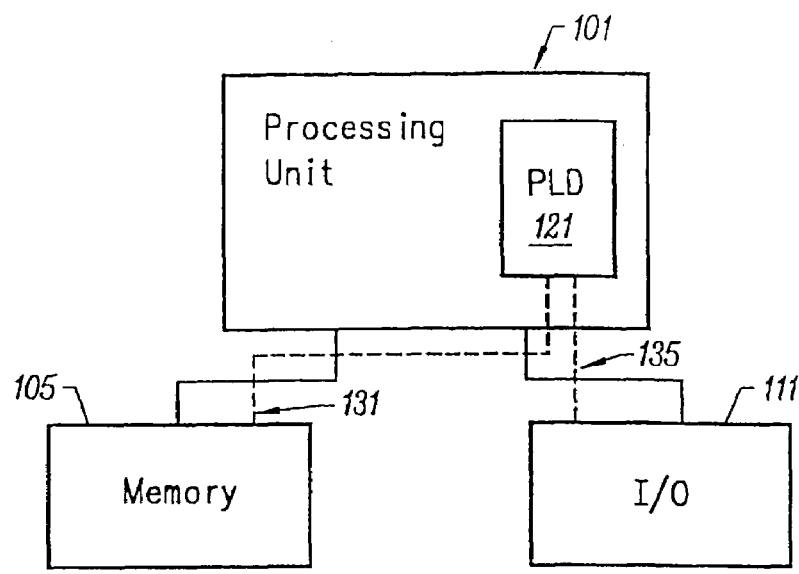
FIG. 1C is diagram of a digital system with a programmable logic integrated circuit.

FIG. 1C shows a block diagram of a digital system, which the system the invention may incorporate or operate on. The system may be provided on a single board, on multiple boards, or within multiple enclosures. Though embodiments of the present invention are useful in electronic and integrated circuits in general, they are particularly useful in programmable logic devices. FIG. 1C illustrates a system 101 in which such a programmable logic device 121 may be utilized. Programmable logic devices or programmable logic integrated circuits are sometimes referred to as a PALs, PLAs, FPLAs, PLDs, CPLDs, EPLDs, EEPLDs, LCAs, or FPGAs and are well-known integrated circuits that provide the advantages of fixed integrated circuits with the flexibility of custom integrated circuits. Such devices allow a user to electrically program standard, off-the-shelf logic elements to meet a user's specific needs and are sold, e.g., by Altera Corporation of San Jose, Calif. Programmable logic integrated circuits and their operation are well known to those of skill in the art.

In the particular embodiment of FIG. 1C, a processing unit 101 is coupled to a memory 105 and an I/O 111, and incorporates a programmable logic device 121. PLD 121 may be specially coupled to memory 105 through connection 131 and to I/O 111 through connection 135. The system may be a programmed digital computer system, digital signal processing system, specialized digital switching network, or other processing system. Moreover, such systems may be designed for a wide variety of applications such as, merely by way of example, telecommunications systems, automotive systems, control systems, consumer electronics, personal computers, Internet communications and networking, and others.

Processing unit 101 may direct data to an appropriate system component for processing or storage, execute a program stored in memory 105 or input using I/O 111, or other similar function. Processing unit 101 may be a central processing unit (CPU), microprocessor, floating point coprocessor, graphics coprocessor, hardware controller, microcontroller, programmable logic device programmed for use as a controller, network controller, or other processing unit. Furthermore, in many embodiments, there is often no need for a CPU. For example, instead of a CPU, one or more PLDs 121 may control the logical operations of the system. In an embodiment, PLD 121 acts as a reconfigurable processor, which can be reprogrammed as needed to handle a particular computing task. Alternately, programmable logic device 121 may include a processor. In some embodiments, processing unit 101 may even be a computer system. Memory 105 may be a random access memory (RAM), read only memory (ROM), fixed or flexible disk media, PC Card flash disk memory, tape, or any other storage retrieval means, or any combination of these storage retrieval means. PLD 121 may serve many different purposes within the system in FIG. 1. PLD 121 may be a logical building block of processing unit 101, supporting its internal and external operations. PLD 121 is programmed to implement the logical functions necessary to carry on its particular role in system operation.

Programmable Logic

Figure 2:
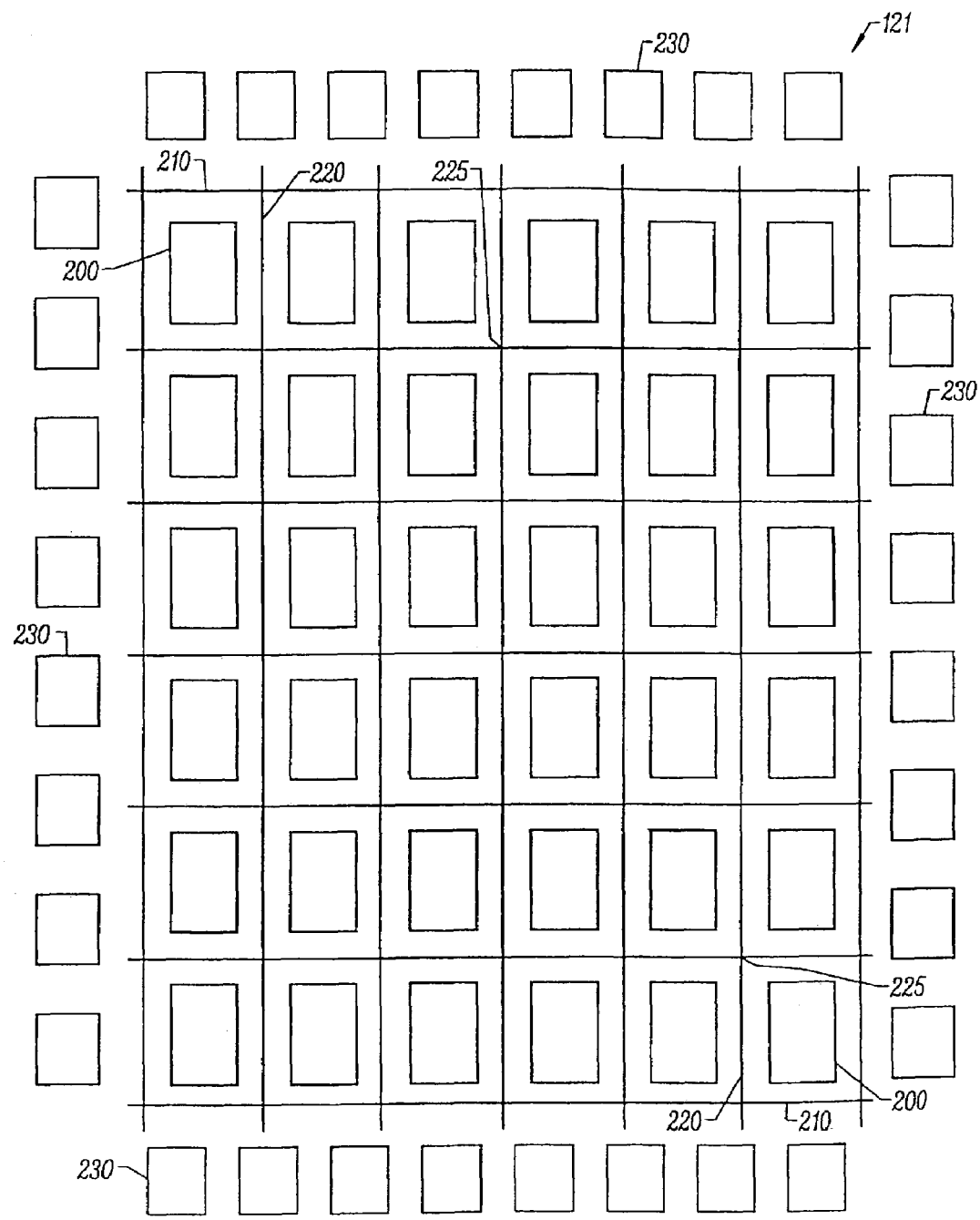
FIG. 2 is a diagram showing a floor plan of a programmable logic integrated circuit.

FIG. 2 is a simplified block diagram of an overall internal architecture and organization of a PLD. Many details of programmable logic architecture, organization, and circuit design are not necessary for an understanding of the present invention and such details are not shown.

FIG. 2 shows a six-by-six two-dimensional array of thirty-six logic array blocks (LABs) 200. LAB 200 is a physically grouped set of logical resources that is configured or programmed to perform logical functions. The internal architecture of a LAB is described in more detail below. The programmable logic portion may contain any arbitrary number of LABs. Generally, in the future, as technology advances and improves, programmable logic devices with greater numbers of logic array blocks will undoubtedly be created. Furthermore, LABs 200 need not be organized in a square matrix or array; for example, the array may be organized in a five-by-seven or a twenty-by-seventy matrix of LABs.

LAB 200 has inputs and outputs (not shown) which may or may not be programmably connected to a global interconnect structure, comprising an array of horizontal interconnects 210 and vertical interconnects 220. Although shown as single lines in FIG. 2, each set of interconnect lines may represent a plurality of signal conductors. The inputs and outputs of LAB 200 are programmably connectable to these sets of interconnect lines, such that multiple LABs 200 may be connected and combined to implement larger, more complex logic functions than can be realized using a single LAB 200.

In other embodiments, the programmable logic integrated circuit may include special or segmented interconnect that is connected to a specific number of LABs and not necessarily an entire row or column of LABs. For example, the segmented interconnect may programmably connect two, three, four, five, or more LABs.

The programmable logic architecture in FIG. 2 further shows at the peripheries of the chip, input and output circuits 230. Input and output circuits 230 are for interfacing the PLD to external, off-chip circuitry. Some or all of these input and output circuits 230 may be consistent with embodiments of the present invention. FIG. 2 shows thirty-two input and output circuits 230; however, a programmable logic integrated circuit may contain any number of input and output circuits, more or less than the number depicted. As discussed above, some of these input-output drivers may be shared between the embedded processor and programmable logic portions. Each input and output circuit 230 is configurable for use as an input driver, output driver, or bidirectional driver. In other embodiments of a programmable logic integrated circuit, the input and output circuits may be embedded with the integrated circuit core itself. This embedded placement of the input and output circuits may be used with flip chip packaging and will minimize the parasitics of routing the signals to input and output circuits.

Figure 3:
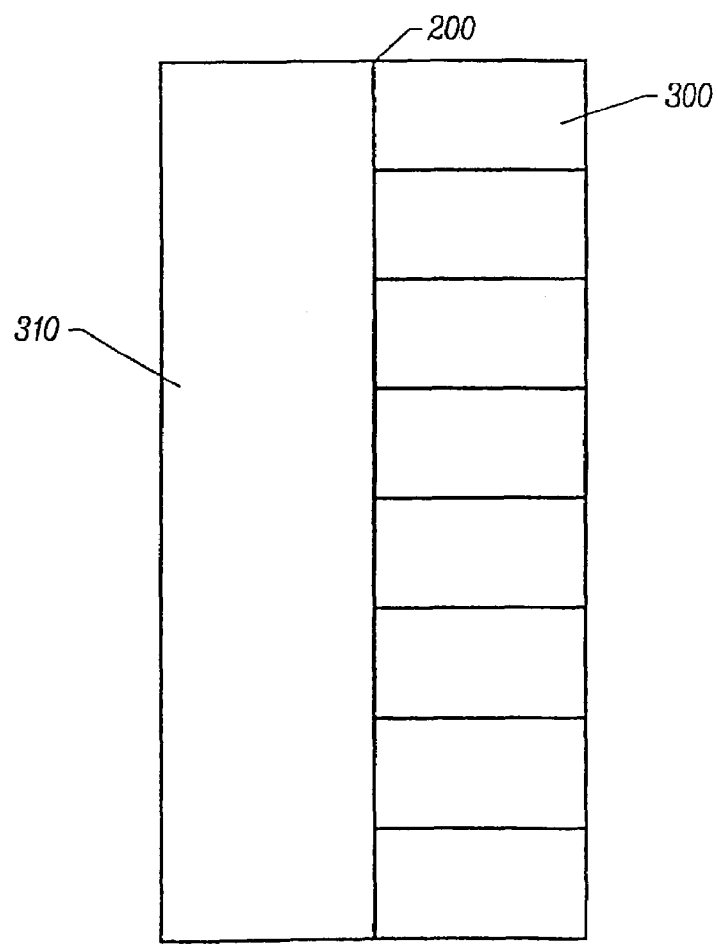
FIG. 3 is a simplified block diagram of a logic array block (LAB).

FIG. 3 shows a simplified block diagram of LAB 200 of FIG. 2. LAB 200 is comprised of a varying number of logic elements (LEs) 300, sometimes referred to as "logic cells" or LCELLs, and a local (or internal) interconnect structure 310. LAB 200 has eight LEs 300, but LAB 200 may have any number of LEs, more or less than eight.

A general overview of LE 300 is presented here, sufficient to provide a basic understanding of the present invention. LE 300 is the smallest logical building block of a PLD. Signals external to the LAB are connectable to LE 300 through local interconnect structure 310. In one embodiment, LE 300 incorporates a function generator that is configurable to provide a logical function of a number of variables, such a four-variable Boolean operation. As well as combinatorial functions, LE 300 also provides support for sequential and registered functions using, for example, D flip-flops. For example, a logic element includes combinational and sequential blocks. The combinational blocks may be implemented using product terms or a look-up table, as a couple of examples. The sequential block may be a flip-flop, D flip-flop, or register.

LE 300 provides combinatorial and registered outputs that are connectable to the interconnect lines 210 and 220, outside LAB 200. Furthermore, the outputs from LE 300 may be internally fed back into local interconnect structure 310; through local interconnect structure 310, an output from one LE 300 may be programmably connected to the inputs of other LEs 300, without using the global interconnect structure.

Figure 4:
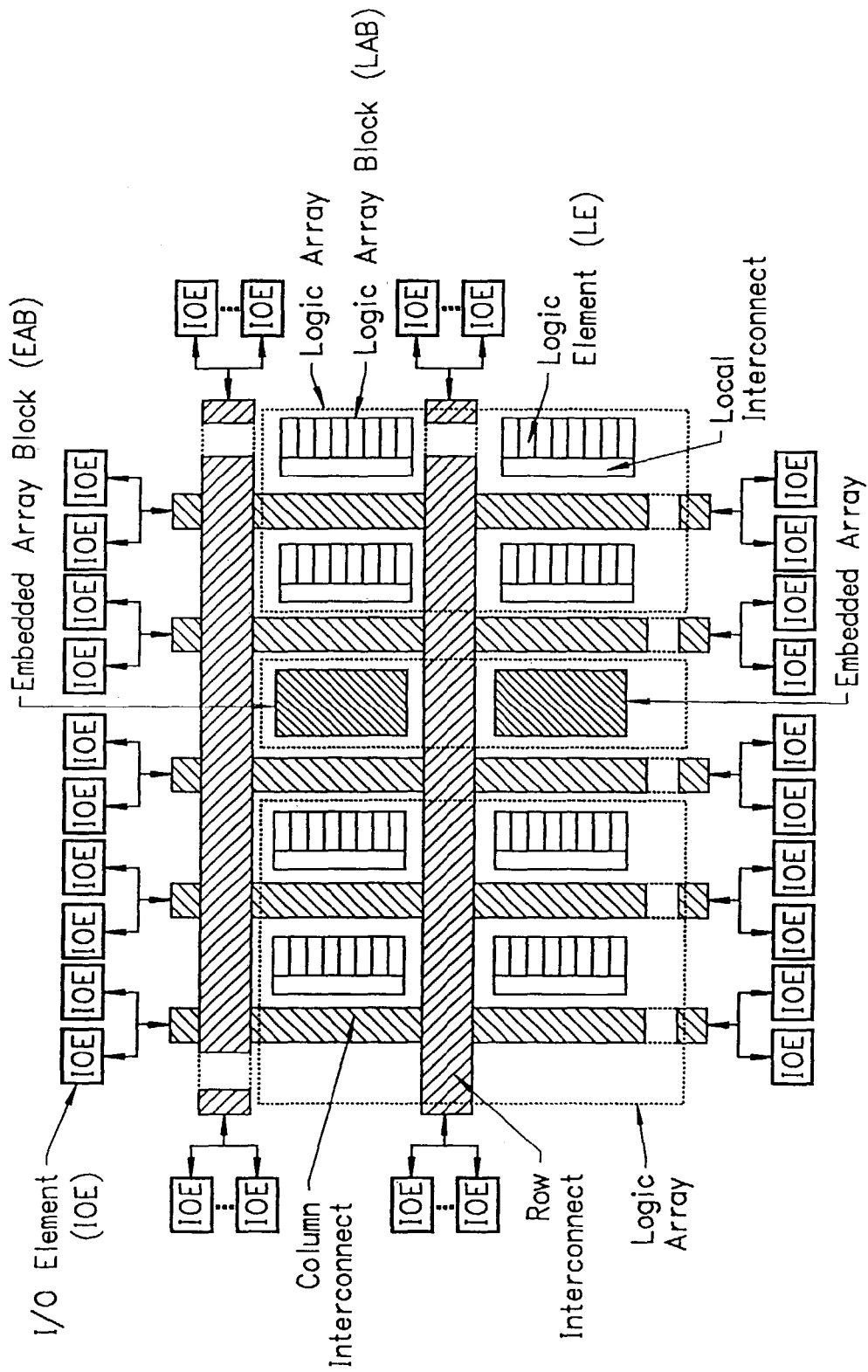
FIG. 4 is a diagram showing a programmable logic architecture with embedded array blocks (EABs) and logic array blocks (LABs).

FIG. 4 shows an example for a typical programmable logic architecture. The architecture in FIG. 4 further includes embedded array blocks (EABs). EABs contain user memory, a flexible block of RAM. The embedded array blocks can be configured as FIFOs acting as frequency translators and serial to parallel converters for interfacing between high-speed input and outputs and the core circuits including the logic array blocks.

Computer Aided Design Flow

Figure 5:
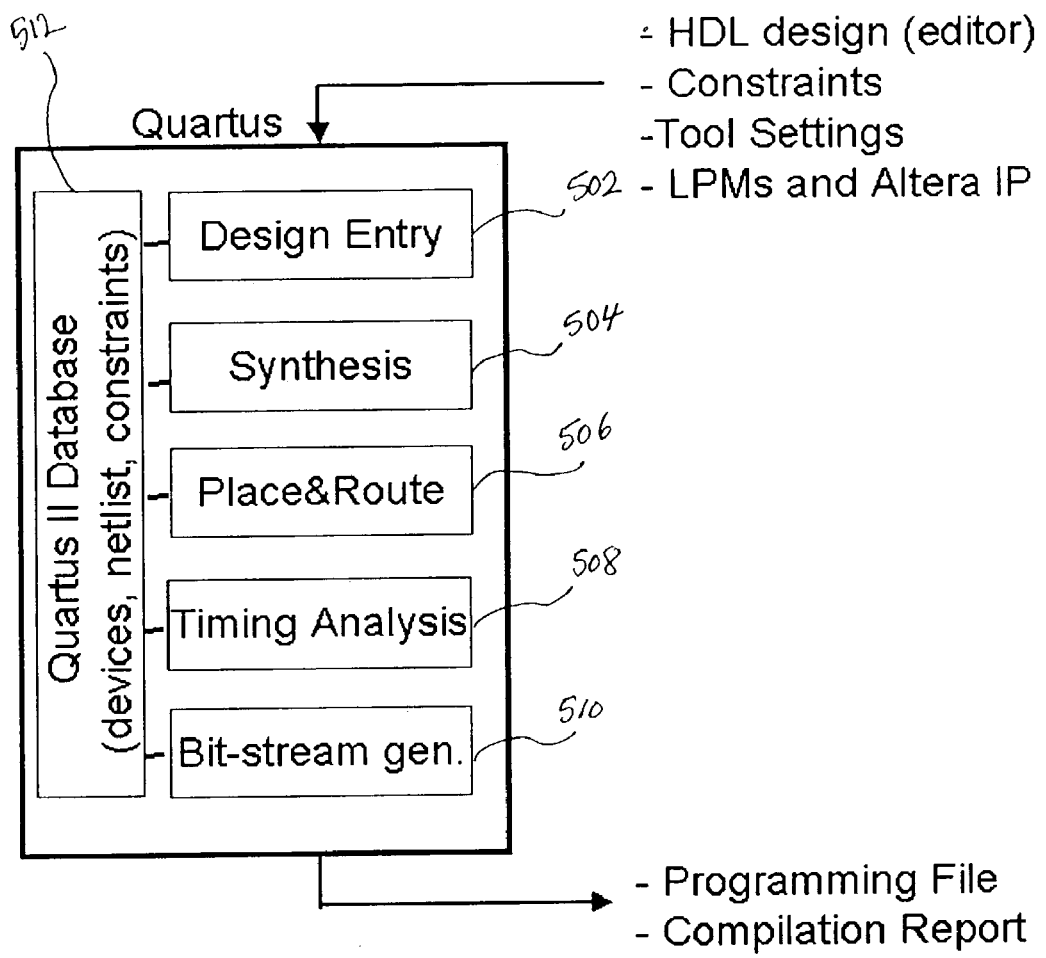
FIG. 5 shows an overall diagram of a computer-aided design (CAD) or electronic design automation (EDA) flow including synthesis.

FIG. 5 shows an example of a flow diagram of a electronic design automation (EDA) or computer-aided design (CAD) tool used in the design of integrated circuits including microprocessors, ASICS, memories, FPGAs, PLDs, and others. In a specific implementation, this flow is used to configure a programmable logic integrated circuit. As discussed above, a user typically programs a programmable logic integrated with the user's desired logic. FIG. 5 is an example of one technique of designing and implementing logic for a programmable logic integrated circuit. At Altera, a particular implementation of the technique of this flow is implemented using a software system referred to as Quartus. This is just an example. One could draw the flow with more or fewer steps and targeting a specific or more general device hardware. The most common implementation of this flow would be as a computer program executing as part of a system similar to that shown in FIG. 1, though other implementations are possible.

The steps of the flow include design entry 502, synthesis 504, place and route 506, timing analysis 508, and bit stream generation 510. Each of these steps in the process may access, store, or retrieve data from a database 512. The database may include devices, a netlist, and constraints.

Design Entry

Design entry is a step of a user specifying his design. Design entry may be performed by schematic capture, entering in logic gates and other logic symbols in a schematic editor. Other techniques of design entry include using a high level design language (HDL) editor. The design is input in a language such as VHDL or Verilog.

Synthesis

Synthesis is a process or method, typically implemented in a software program, for converting the input design from a high-level design language such as VHDL or Verilog into an optimized netlist of gates mapped into the target technology. In the case of programmable logic this often, but not always, includes 4-input lookup-tables (LUTs) and a D-type flip-flops (DFFs). There are many other details and differences not described here.

Synthesis can be either hard-coded as an algorithm, or controlled through a script. Though conceptually similar as a method of computation, the latter is common because it allows for more flexibility and also allows substitute scripts to be used as an option in the flow. The concept of a script for synthesis is largely due to the SIS synthesis system from Berkeley. For more information, see E. M. Sentovich, K. J. Singh, L. Lavagno, C. Moon, R. Murgai, A. Saldanha, H. Savoj, P. R. Stephan, R. K. Brayton, and A. L. Sangiovanni-Vincentelli, *SIS: A System for Sequential Circuit Synthesis*, Technical Report UCB/ERL M92/41, Electronics Research Lab, Univ. of California, Berkeley, Calif. 94720, May 1992.

There are many algorithms in synthesis. The following are some examples of algorithms that are available for calling in a typical synthesis system. A synthesis operation may be to remove redundant logic. Some techniques includes sweep, two-level minimizer, one-hot state machine minimizer, odc (observability don't care) stuck feedbacks, odc combinatorial logic, odc secondary signals, reduce secondary signals, convert silly LUTs to logic, and remove redundant loop cuts. A synthesis operation may include restructuring and removing redundant logic. Some techniques include resynthesizing fan-out-free cones and resynthesizing cones through fan out. A synthesis operation may include restructuring. Some techniques include eliminate, factor sum-of-products, decompose to two inputs, widen, make sum-of-products, and extract aload (i.e., asynchronous load) signals. A synthesis operation may include removing duplicate or redundant combinational logic or registers, extracting common cubes, or XORs. A synthesis step in a CAD flow may include any combination or all of these operations, and may include other operations too.

More specifically, the algorithms to remove redundant logic include: (1) Sweep: propagates constants through the netlist. (2) Two-level minimizer: minimizes the number of AND-gates in each sum-of products. (3) One-hot state minimizer: minimize logic in state machine making use of the knowledge of the possible and impossible states of the registers. (4) Odc stuck feedbacks: remove registers and combinational loops that are stuck at some specific value due to a feedback from their own output. (5) Odc combinatorial logic: observability don't care minimization that uses knowledge about when a gate value is not observable to minimize it. (6) Algorithms to reduce secondary signals: minimize secondary signals on registers. (7) Convert silly LUTs to logic: absorb more input logic in existing LUTs if possible. Convert LUTs of which not all inputs are used into simple combinatorial gates. (8) Remove redundant loop cuts: remove cut buffers that are not part of a combinatorial loop.

The algorithms to restructure logic include: (1) Eliminate: flatten logic into less levels. (2) Factor sum-of-products: apply algebraic factoring on a sum-of-products to add more levels of logic. (3) Decompose to two inputs: decompose each AND, OR and XOR gate with more than two inputs into a tree of gates each with two inputs. (4) Widen: flatten trees of the same type of gates w/o inverters into one gate with more inputs. (5) Make sum-of-products: change the logic so that it is built up of sum-of-products only (a sum-of-products is an OR gate fed by AND-gates only, such that there are no inverters between the AND and OR gates, and each AND gate fans out only to this OR gate). (6) Extract aload signals: change registers to use asynchronous load instead of clear and preset.

The algorithms to restructure and remove redundant logic include: (1) Resynthesize fanout free cones: flatten fanout free cones into sum-of-products, call two-level minimizer and factoring algorithm on sum-of-products. (2) Resynthesize cone through fanout: flatten any cone into sum-of-products, call two-level minimizer and factoring algorithm on sum-of-products.

The algorithms to share duplicate logic: (1) Extract cubes: extract common AND gates from different AND gates in the netlist, and extract common OR gates from different OR gates in the netlist. (2) Extract common XORs: extract common XOR gates from different XOR gates in the netlist. (3) Remove duplicate logic: remove gates with the exact same inputs as other gates and redirect their fanout to the duplicate gate. (4) Remove duplicate registers: remove registers with the exact same inputs as other registers and redirect their fanout to the duplicate register.

In an implementation, technology mapping (or tech mapping) is part of synthesis, and generally comes at the end of synthesis. In an alternative implementation, tech mapping may be part of the place and route. Tech mapping converts the netlist into another which matches the logic structure of the target architecture. For example, for programmable logic, tech mapping converts the netlist into a format for the logic blocks, look-up tables, flip-flops, and other logical elements of the programmable logic architecture.

Table A below shows an example of a synthesis script.

TABLE A

1. Minimize logic
   two-level minimizer, odc, remove duplicate logic, DFFs
2. Collapse to remove structure
   Eliminate
3. Minimize & add structure 1
   Two-level minimizer, factor, resynthesize
4. Minimize & add structure 2
   Two-level minimizer, factor, resynthesize
5. Extract duplicates
   Remove duplicate logic, DFFs, extract common cubes Synthesis need not be part of the same system as the other parts of the flow. In particular, any number of separate tools could perform the synthesis operation and then feed the resulting technology-mapped netlist into the middle part of the flow. For example, synthesis tools produced by the Synplicity Corp. of Sunnyvale, Calif. or Mentor Graphics Corp. of Wilsonville, Oreg. produce synthesis tools which directly feed the Quartus CAD tools produced by Altera Corp. of San Jose, Calif.

In these cases, one may refer to the first synthesis as arising from a "third party tool" (where the first party is our tool and the traditional second party being the user of the tool). Because the third-party tool provides a netlist which is already synthesized, the first-party tool treats this as a "WYSIWYG" netlist. WYSIWYG stands for "what you see is what you get."

Place and Route

Place and route is a process or method of choosing individual physical locations on a chip, board or other physical hardware implementation for each cell in the netlist, and then performing the connections between them. Placement places cells of the netlist into the target hardware architecture. Routing performs physical wiring connections between cells. For the specific embodiment of programmable logic, this means determine which logic elements (and their look-up tables) implement particular functions and how the signals are routed using the interconnect, global and local.

Timing Analysis

Timing analysis determines the electrical or other delay and thus the performance or timing of the eventual hardware. For example, timing analysis evaluates the delays between registers and I/Os to determine the potential performance (i.e., speed) of the design. Using timing analysis, a user will have a good estimate as to the performance of his logic implemented in the integrated circuit (e.g., programmable logic). At this point, the design has not been implemented in the device, and the user can change the design as needed to obtain the performance the user desires. For example, if the speed path is not fast enough, the user can make design changes and go though the CAD flow again. Design is sometimes an iterative process, where the user tries a design, sees the results using timing analysis, makes changes to the design, and sees the results again. This process may be repeated many times as needed.

Bitstream Generation

The step of "bitstream generation" is specific to the example of FPGA or PLD devices which are programmed by a bitstream. In particular, the design is converted into a stream of bits that will be loaded into the FPGA or PLD device to configure it to the user's design. This step is optional since it is not needed for certain integrated circuits, such as ASICs (which are hard-programmed using masks or lasers instead of a bitstream).

Each of these steps in the FIG. 5 flow above is commonly broken down into further steps. In an embodiment, the invention is a resynthesis technique and may add additional steps to the flow or may be additional steps within one of the existing steps.

Resynthesis

Figure 6:
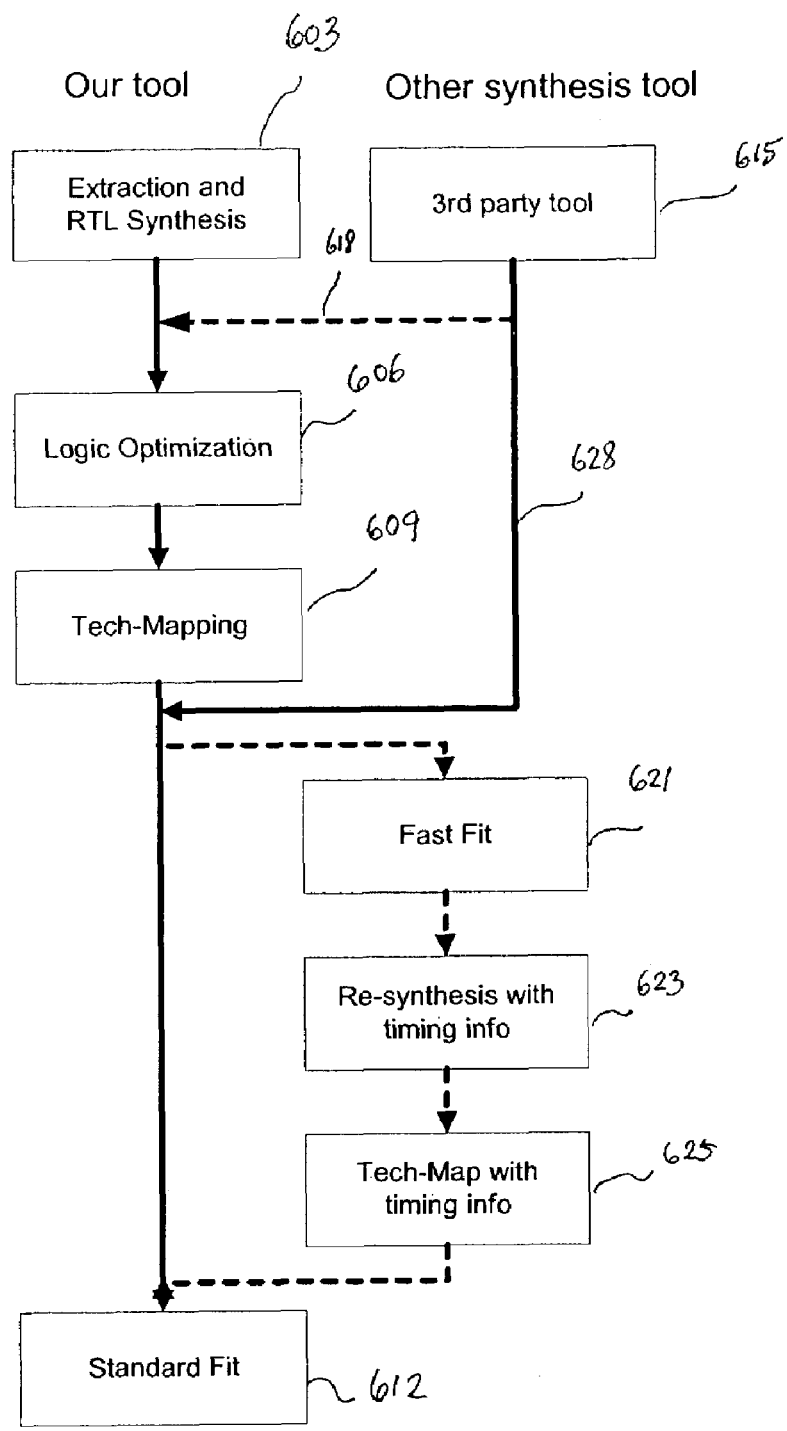
FIG. 6 shows another CAD flow including a fitter feedback flow, which includes a resynthesis operation.

FIG. 6 shows an overall diagram of a resynthesis flow of the invention. The invention refers specifically to a set of changes or related modifications to the basic flow (an example of which is shown in FIG. 5) that involves a second call to the synthesis portion of the flow. Although this patent application describes a second synthesis in a CAD flow, the invention may be extended to a flow having more than two synthesis calls. For example, there may be three, four, five, or more synthesis steps in the CAD flow. Subsequent synthesis calls may be referred to as resynthesis. In a specific implementation, the changes to implement resynthesis include the ability to:

1. Resynthesize a netlist arising from a completely different "third party" synthesis tool.

2. Resynthesize the netlist after placement, using timing information from the place and route operation.

3. A combination of the two where a third-party netlist is resynthesized after placement.

In all of these, it may be advantageous to apply an alternative set of synthesis algorithms in the second or subsequent stages of synthesis.

According to an aspect, the invention is for resynthesis, which is a second (or subsequent) iteration of synthesis either by a different method or by the same method in which additional information has been determined by another method. A resynthesis operation may be implemented in one or a combination of multiple forms.

Though not limited to this operation, the following are three specific implementations of resynthesis:

1. Beginning with a pre-synthesized and tech-mapped netlist which is already tech-mapped into 4-LUT+DFF atoms suitable for place and route:

a. Unmap the technology-mapped logic, resynthesize using an alternative algorithm, and re-tech-map using an improved technology-mapping algorithm.

b. As (a) with gate-level retiming (discussed in U.S. patent application Ser. No. 10/446,650, filed May 27, 2003, which is incorporated by reference).

2. Beginning with a HDL (such as VHDL or Verilog or System Verilog or SystemC, and others) description, perform the place and route step to determine real delays on edges, and then return to synthesis in a second pass with known delays, and perform synthesis and tech-mapping using these delays. Retiming may or may not be used during this second synthesis.

3. Combining (1) and (2), starting with a previously tech-mapped netlist, perform place and route then back-annotate delays and resynthesize as per (2).

FIG. 6 shows the modified flows at the high level. Relative to FIG. 5, the design entry and timing-analysis and bitstream generation steps have been left out, and the synthesis step has been divided into three substeps of extraction and RTL synthesis 603, logic optimization 606, and technology mapping 609. Standard fit 612 is an alternative name for place and route.

The two standard flows through synthesis and placement are shown in solid lines. In the first flow, the "first party" tool performs all the steps 603, 606, and 609. In the second standard flow, a third-party tool 615 performs the first three steps, and the result of this is used for fitting (or place and route).

The modified flows are shown in dotted lines. In one flow (indicated by dotted line 618) the WYSIWYG netlist from the third party tool is unmapped to primitive gates and resynthesized using the first-party tool. In an alternate flow, the output of tech-mapping goes through the three new steps, fast fit 621, resynthesis with timing info 623, and tech map with timing info 625. Since the output of tech-mapping can be from any of the standard first-party (from step 609), standard third party (through line 628), or modified resynthesis third party (through line 618), there are three ways to get to the output of tech mapping. Thus FIG. 6 represents six possible flows in total, three of which may not include resynthesis 623 (i.e., 603 to 612 bypassing resynthesis, 615 through 618 to 612 bypassing synthesis, and 615 through 628 to 612 bypassing synthesis).

Steps 621, 623, and 625 form a flow that may be referred to as "fitter feedback." In these cases an abbreviated fit is performed (such as a fast fit or abbreviated place and route), which determines the correct wire-delays in the netlist after placement (box 621). These delays are backannotated to the synthesis netlist, and synthesis is performed again (box 623) and then tech-mapping is performed again (box 625).

FIG. 6 shows a particular implementation where timing info is used to make optimizations. However, in other embodiments, other metrics may be used such as area or power. In another embodiment, step 623 uses some fitter information, not only timing information, and step 625 uses some fitter information, not only timing information.

Though not required, it may be more efficient to execute the first fit (placement or place and route) in "fast" mode, because approximate estimates of final timing are sufficient.

A purpose of the fitter feedback flow is as follows. In synthesis the "longest path" is determined based on the number of cells or nodes in the synthesis netlist or graph. However, the way that these cells are placed by the place and route tools can result in some edges having delay of 300 picoseconds and other edges having delays 10 times that time (3000 picoseconds) or more. Thus the decisions made by the synthesis tool could be counter-productive because the true critical path may not be the same in placement as what was optimized in synthesis.

Thus a goal of the resynthesis flows is to correctly identify the timing critical and area critical ("not timing critical") portions of the netlist prior to the second call to synthesis. This allows the second call to synthesis to perform timing optimization on the timing-critical portions, and area optimizations on the rest.

The resynthesis may optimize for power in addition to or instead of optimizing for area and speed. A purpose of the fitter feedback flow might also be to get a more accurate estimation of the power consumption of the design on the device. Hence, another goal of the resynthesis flows might be to correctly identify the parts of the netlist that consume a lot of power or the parts of the netlist that are placed in "hot spots" prior to the second call to synthesis. This allows the second call to synthesis to perform optimizations targeting lower power consumption on those parts of the netlist. Those optimizations include, but are not limited to techniques such as the creation of gated clocks.

This application discusses details of the following: (a) The tech-mapping algorithm used. (b) The method for performing fast-fit. (c) The method for back-annotating timing delays to synthesis, including gap-filling, or putting delays on the edges internal to LUTs and hence not seen by the fitter, but which exist after unmapping. (d) The method for unmapping a tech-mapped netlist to primitive gates (used for both the WYSIWYG resynthesis and fitter-feedback flows).

Unmapping

Unmapping is used in WYSIWYG resynthesis (resynthesis of results from a third-party synthesis tool 615). The goal of the unmapping algorithm is to convert a netlist of cells mapped to the target technology. In a specific implementation, unmap 4-LUT+DFF Altera "logic elements" into basic gates. Table B provides pseudocode for an unmapping flow.

TABLE B

For each LE x in the netlist
    If (excluded(x) && !override(x)) iterate.
    Separate register and LUT portions of the LE x
    Recursively factor the LUT-mask (logic function) of the 4-LUT to
reduce the LUT to a set of gates. Another approach is to generate a
sum-of-products from the LUT-mask.
Optimize the netlist as per standard synthesis logic-optimization
algorithms. Other algorithms may be used.

In the pseudocode, the routine "excluded" comes because the algorithm chooses to not unmap some types of cells. For example, in an implementation, a partial list of such exclusions are:

(a) the cell has been marked "don't_touch" by a logic option (i.e., a user selected option or an option derived from implicit conditions such as described below);

(b) the cell is involved in a carry-chain (Altera-specific function of the LE which means it is in an arithmetic function shared with its neighbors);

(c) the cell is involved in a 4:1 mux (because we found better results to exclude such cells);

(d) the cell is involved in a finite-state-machine (in an embodiment, these are not excluded, but it is an example of one type that could be excluded); and (e) the cell is involved in a cascade chain (other special purpose hardware in Altera LEs).

The routine "override" comes because we allow the user to set a logic option on an cell (or on a hierarchy of logic) which allows all the other rules to be ignored—i.e., to unmap logic even if it is a 4:1 mux.

If the unmapping is being performed as part of the fitter-feedback flow, a further step called gap-filling is required. Gap-filling is not required for the WYSIWYG resynthesis flow. This will be discussed later.

Figure 7:
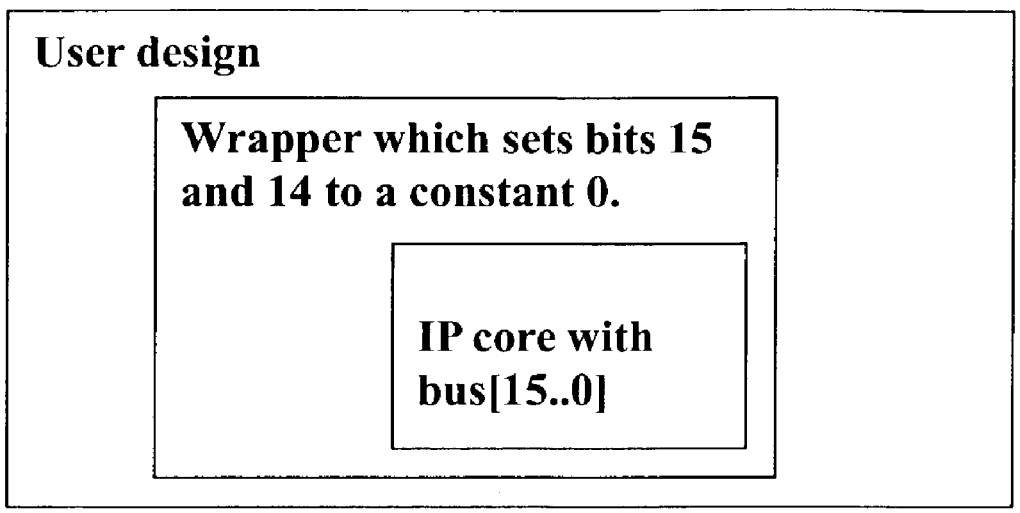
FIG. 7 shows a third party intellectual property (IP) core instantiated with a wrapper inside an overall design.

One key benefit of WYSIWYG resynthesis is a form of incremental compilation. In some cases, prepackaged IP cores (subdesigns made for sale and integrated into the user's design from either the user or IP core developer) will be WYSIWYG netlists, but because of the context they are used in some portions are actually redundant. Processing these with the fitter feedback flow or remapping without going through filter feedback flow (e.g., box 615 through 618 to 606 and then bypass box 623) will allow portions of the core to be synthesized to a smaller number of LEs. See FIG. 7, which shows a WYSIWYG IP core instantiated with a wrapper inside the overall design. For example, WYSIWYG resynthesis allows the internal core to be resynthesized to only 14 bits rather than 16, thus saving area.

Another key benefit is the possibility to optimize for low power. Power reduction is becoming increasingly important and this feature might be key especially but not exclusively for future technologies. There are a multiple optimizations for low power possible. They include, but are not limited to techniques such as the creation of gated clocks, the use of gates or LUT masks (in the case of LUT-based circuits) that reduce the toggle rate, slowing down the clock, and so forth.

Tech Mapping

In an embodiment, the tech-mapping algorithm is called DelayMap. Table C provides pseudocode for an implementation of DelayMap.

TABLE C

// label the design then map the design. The subroutines and main procedures are described as follows.
Procedure wire_delay (source_gate_type, destination_gate_type)
{
    // The delay is based on a statistic cell-based wire delay model detailed in [0276].
    Given a wire from source to destination, lookup for a predefined delay value for that wire in the 2-dimensional table to return a delay value for the wire.
    // The 2D table is pre-constructed by experts who have knowledge on FPGA architectures and logic synthesis algorithms. It can also be implemented as a series of if statements that compare the source and destination gate types and return a hard coded delay value when a if statement is satisfied. If no if statement is satisfied, a default value is returned.
}
Procedure arrival_time (gate)
{
    If this gate is a LUT that covers a primitive gate, then let this LUT be in place and be the gate.

TABLE C-continued

Calculate the signal arrival time at the gate output as follows:
        Fetch the maximal signal arrival time at this gate's fanin gates (computed previously).
        Lookup the delays on the wires that connect fanin gates and this gate using wire_delay( ) procedure.
        Lookup the static delays through this gate.
        Add the three numbers as the signal arrival time at the gate's output.
}
Procedure label_a_gate (gate)
{
    If this gate is NOT a primitive logic gate, then
        Calculate the signal arrival time at this gate's output using arrival_time(gate) procedure.
    If this gate is a primitive logic gate (e.g. AND, OR, NOT), then
        For each possible covering LUT at the gate, repeat the following computation.
            Cover the gate with the LUT such that the LUT output replaces the gate output.
            Calculate the signal arrival time at the LUT output using arrival_time(LUT) procedure.
        Among all arrival times, save the minimum one as the signal arrival time at the gate's output.
    Label this gate with the signal arrival time at the gate's output.
}
Procedure label (design)
{
    Traverse the gates in the design in a topological order (input toward output.)
    During the traversal, label each gate with label_a_gate(gate) procedure.
}
Procedure map_a_gate (gate)
{
    For all possible covering LUTs at the gate, select one of them according to the following rules.
        The LUT must meet the signal arrival time at the gate (labeled by label_a_gate( ).)
        If there are more than one choices, select the one that leads to minimal area as estimated by empirical area-cost function.
    Replace the gate with the selected LUT.
}
Procedure map(design)
{
    Traverse the gates in the design in a backward topological order (output toward input).
During the traversal,
    If the gate feeds either a non-combinational gate or a LUT, then call map_a_gate(gate) function.
    Otherwise, skip this gate.
    Keep LUTs and remove gates.
}
Procedure DelayMap(design)
{
    Label the design using label(design) procedure.
    Map the design using map(design) procedure.
}

As discussed above, the retiming algorithm is optional. Note that the resynthesis flow may be also described as "remapping," and the terms interchangeably. The user can independently turn on retiming.

Fitter Feedback

Steps 621, 623, and 625 of FIG. 6 are in the fitter feedback flow. This portion of the flow works the same, whether the starting point is an unmapped third party netlist or whether it is the result of synthesis 603, starting with the "post tech-mapped netlist."

The goal of using fitter information is that the view of timing in synthesis is very coarse. Though synthesis sees a path with six LCELLs as being longer than one with four LCELLs, after placement it is easily true the four LCELLs path is the one with the longest delay. By doing a partial placement and then sending the timing delays back to synthesis, the algorithm is able to reoptimize the logic in the netlist to improve the critical path that is important to placement, even if it is the shorter one in terms of unit delay, each LCELL corresponding to one unit of delay.

A goal of returning to synthesis is that even though the fitter has better visibility of timing, it has less ability to make a difference. In general, the earlier in the flow the more benefit can be made by restructuring the logic, but the lower the visibility is of what logic needs to be restructured.

This algorithm is a first step towards integrating the physical part of the CAD flow (placement with or without routing) with the logical portion (synthesis). The three boxes 621, 623, and 625 of FIG. 6 represent the additions for the fitter feedback or use-fitter-info flow. When the fitter-info netlist optimization is turned on, either the tech-mapped result of native synthesis or the unmapped third-party netlist is taken through a fast placement. Timing delays on each net in the fitter's netlist are backannotated to synthesis. Synthesis then unmaps the netlist into primitive gates, and interpolates the timing delays onto the gate-level netlist.

In the resynthesis phase, nets are identified as critical or noncritical based on their slack ratios (described in Timing and Slack section below) returning from the fitter. The portions of the netlist identified as timing critical are remapped with a bias towards improved timing. The portions of the netlist which are not timing-critical are then remapped with the area-mapper. The overall goal is to simultaneously save both area and improve fmax. In an embodiment of the invention, the flow will optimize speed after area because the timing synthesis step will then have better visibility of what exists in terms of area and can better estimate the timing. However, in other embodiments speed may be optimized before area, only speed is optimized, or only area is optimized.

In an embodiment of the invention, actual delays are used during the resynthesis operation. However, in another embodiment, actual delays are not used, but rather edges are classified based on whether they are seen as critical or not critical.

Table D shows an embodiment of fitter feedback in pseudocode.

TABLE D

<<beginning with tech-mapped netlist>>
  Perform a fast fit
  Backannotate slack ratios for each edge in the fitter netlist.
  For all nodes with slack ratio < a constant "c"
    Unmap these nodes (leaving others mapped) and resynthesize/
    tech-map for delay.
  For all nodes with slack-ratio > a different constant "d"
    Unmap those nodes (leaving others mapped) and resynthesize/
    tech-map for area.
<<continue with final fit>>

Table D shows a particular implementation for a slack ratio and how it is compared against a constant. However, in other implementation, a different definition of a slack ratio may be used. For example, the slack ratio may be defined as the inverse of the way it is defined in table D. Then the comparisons against the constant values may be made in reverse. There are a multitude of possibilities. For example, a pseudocode routine would replace "for all nodes with slack ratio<a constant 'c'" with "for all timing critical nodes." And, replace "for all nodes with slack ratio>a different constant 'd'" with "for all nontiming critical nodes."

One of the drawbacks with this form of netlist optimization is an increase in compile time. In the basic flow, there is one synthesis and one fitter operation. In the new flow requiring the longest compile time (i.e., box 615 through 618 through 621, 623, and 625 to 612), there are two extra synthesis steps (i.e., unmap-remap in the first pass and unmap-remap for speed and area in the second) and a fast-fit.

A fast fit can be accomplished, using any compile time inexpensive placement tool (with or without routing) such as a simulated annealing based filter, with either a modified accelerated "schedule," or by an abort after some portion of the schedule. With the fitter-info option, there is an additional improvement in area (LE count). This is because part of the netlist is remapped for improved area. In a specific case, on average, remapping the noncritical cells with the area mapper gives a four percent decrease in the number of logic elements. However, depending on the specific implementation and target architecture, the results may vary.

Though an aspect of the invention is a unified flow, in another embodiment, the invention includes a fitter feedback flow that can also be called as a sequence of tools in a script. For example, the fitter feedback flow may be called from Perl or TCL script. This is because fitter.exe and synthesis.exe are separate programs, communicating using a persistent database.

Data is either transient or persistent to a particular application. Persistent data exists outside of the application's active memory, usually in a database or flat file system. In this way, the application is able to retain information from one execution to the next. An embodiment of such a persistent database might be a collection of archive files. Data is written to and read from those files throughout the compilation process.

Figure 8:
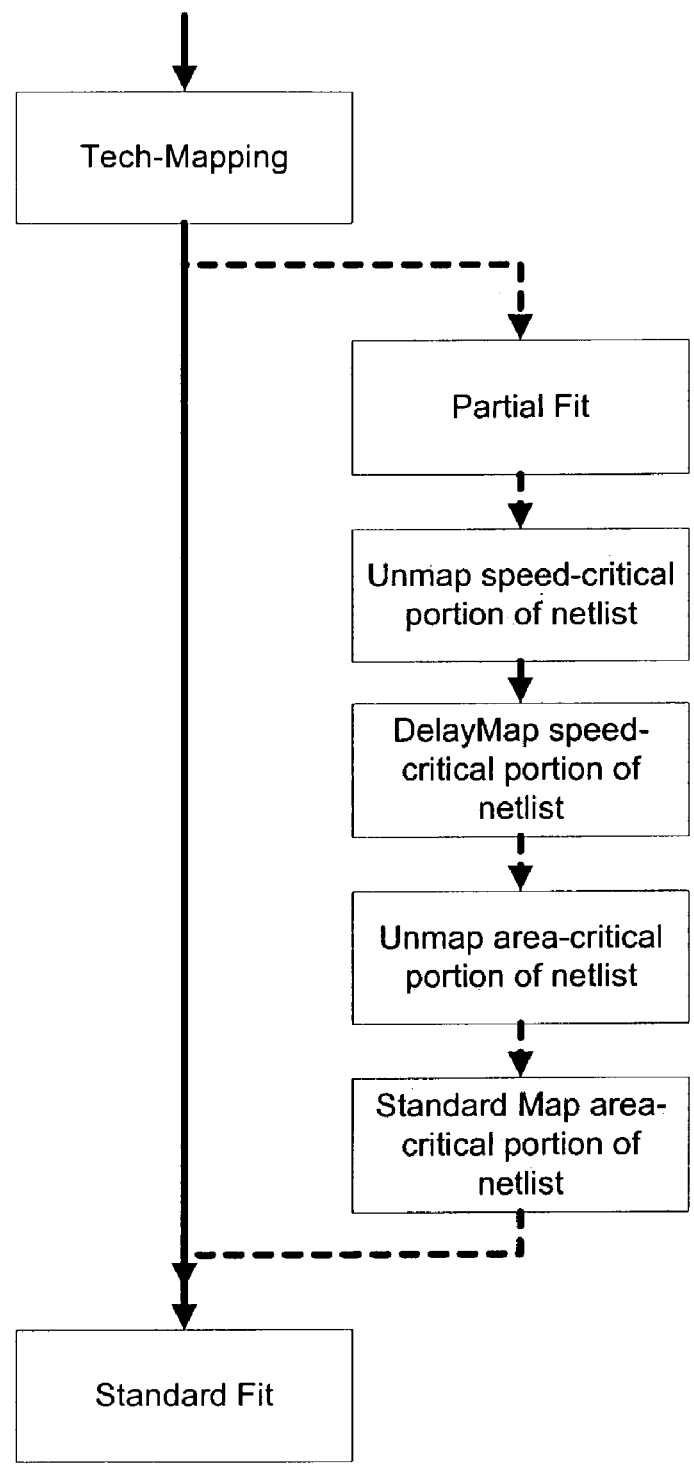
FIG. 8 shows a specific implementation of a fitter feedback flow with resynthesis, where a design is optimized for speed or area based on binary metrics.

FIG. 8 shows another embodiment of a fitter feedback flow. A binary metric is used to determine the timing critical and area critical portions. Refer to Table D. Specifically, a partial fit is done. Then, speed-critical portions of the netlist are unmapped. Tech-map or DelayMap speed critical portions of the netlist. Unmap area-critical portions of the netlist. Then standard map area critical portions of the netlist.

Table E provides pseudocode for a routine that is executed when coming back form the fitter. The code annotates the timing information to the mapped gate level netlist.

TABLE E

```
// This is the pseudo code of the program that is executed when coming
back from the fitter and that annotates the timing information to the
mapped gate level netlist.
annotate_technology_mapped_gates( )
{
  access_timing_info_from_fitter( );
  annotate_timing_info_to_technology_mapped_gates( );
  fill_in_timing_info_on_not_annotated_tech-
  nology_mapped_gates( );
}
annotate_timing_info_to_technology_mapped_gates( )
{
  // timing information pieces are characterized by from, to, timing info
  for all timing information pieces from the fitter
  {
    this_timing_info = current timing information piece;
    from_gate = technology mapped gate corresponding to from;
    if from_gate found
    {
      to_gate = technology mapped gate corresponding to to;
      if to_gate found
      {
        find all gates on paths between from_gate and to_gate;
        for all gate inputs on paths between from_gate and to_gate
        {
          if no timing info present or if this_timing_info is more critical
than previously annotated timing infos
```

TABLE E-continued

```
    {
      compute current_confidence based on number of paths,
position of gate in the current path, and diverging paths;
      annotate the current gate input with this_timing_info;
      annotate the current gate input with a current_confidence;
    }
  }
}
else // no to_gate found
{
  compute current_confidence based on fanout of from_gate;
  for all gate inputs driven by from_gate
  {
    if current gate input has no timing info present or if previously
annotated confidence value smaller than current_confidence
    {
      annotate the current gate input with this_timing_info;
      annotate the current gate input with current_confidence;
    }
  }
}
else // no from_gate found
{
  to_gate = technology mapped gate corresponding to to;
  if to_gate found
  {
    compute current_confidence based on fanin of to_gate;
    for all gate inputs of to_gate
    {
      if no timing info present or if previously annotated confidence
value smaller than current_confidence
      {
        annotate the current gate input with this_timing_info;
        annotate the current gate input with current_confidence;
      }
    }
  }
}
}
fill_in_timing_info_on_not_annotated_technology_mapped_gates( )
{
  for all gate inputs without annotated timing info
  {
    current_input = currently investigated input;
    driver_gate = driver of current_input;
    for all inputs of driver_gate
    {
      driver_input = currently investigated input of driver_gate;
      this_timing_info = least critical;
      this_confidence = lowest confidence;
      if driver_input has timing info annotated
      {
        if driver_input's timing info more critical as this_timing_info
and driver_input's confidence bigger that this_confidence
        {
          this_timing_info = driver_input's timing info;
          this_confidence = driver_input's confidence;
        }
      }
      else
      {
        if not in combinational loop
        {
          all_driver_inputs_annotated = false;
        }
      }
    }
    if all_driver_inputs_annotated
    {
      annotate current_input with this_timing_info;
      annotate current_input with this_confidence;
    }
  }
}
```

Figure 9:
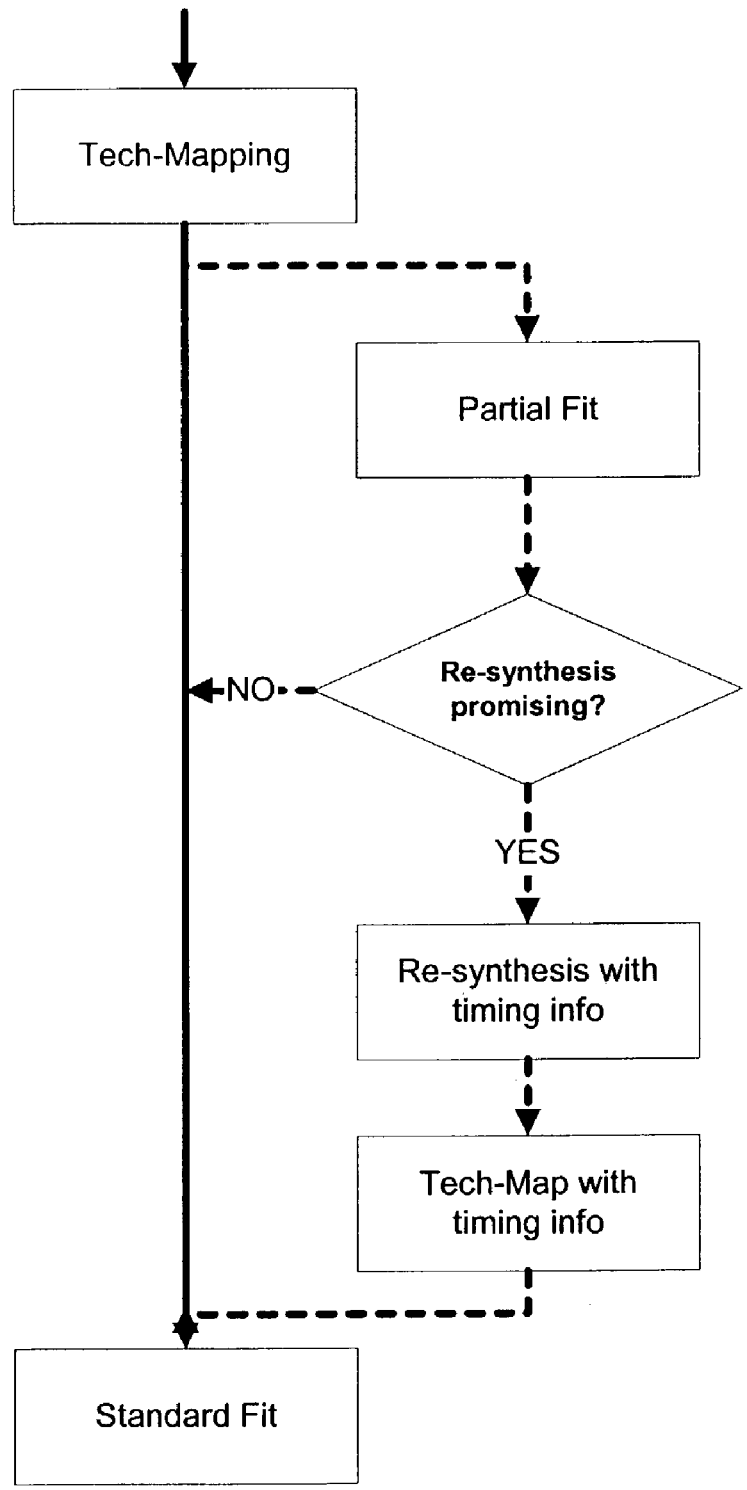
FIG. 9 shows another specific implementation of a fitter feedback flow where resynthesis may or may not be performed based on determination such as whether there will be improvements, speed or area, to the design.

FIG. 9 shows a further embodiment of a fitter feedback flow. This embodiment has a decision in the flow based on metrics determined by a partial fit. If the metrics do not look promising, resynthesis is not performed, but if the metrics look good, resynthesis is done.

Table F provides pseudocode for the unmapping operation within the fitter feedback flow.

TABLE F

```
// This is the pseudo code that describes the un-mapping of LUTs and
WYSIWYGs as well as the annotation of these newly created gates with
timing information
unmap_and_annotate( )
{
  // during optimizing the timing critical region, only timing critical
LUTs and WYSIWYGS
  // can be un-mapped
  label all LUTs and WYSIWYGs that cannot be un-mapped;
  for all LUTs and WYSIWYGs
  {
    if current LUT or WYSIWYG allowed to un-map
    {
      un_map_current_lut_or_wysiwyg( );
      annotate_created_gates_with_timing_info( );
    }
  }
}
annotate_created_gates_with_timing_info( )
{
  copy timing information from the original inputs to the un-mapped
inputs
  copy confidence values from the original inputs to the un-mapped
inputs;
  create topological order of gate inputs;
  for all gate inputs in this topological order from inputs to outputs
  {
    annotate the current input that is not annotated with the most critical
timing information of all inputs on gates driving the current input;
    annotate the current input with the same confidence value as the input
from which the timing information was copied;
    update all inputs of the driver gate with their current delay minus
the forward annotated delay;
  }
}
```

Interpolation of timing information to synthesis gates created by unmapping LUTs is described by pseudocode in function annotate_created_gates_with_timing_info( ) in table F. Interpolation of timing information to LUTs that cannot be found during matching is described by pseudocode in function fill_in_timing_info_on_not_annotated_technology_mapped_gates( ) in table E.

Specific Implementations

Figure 10:
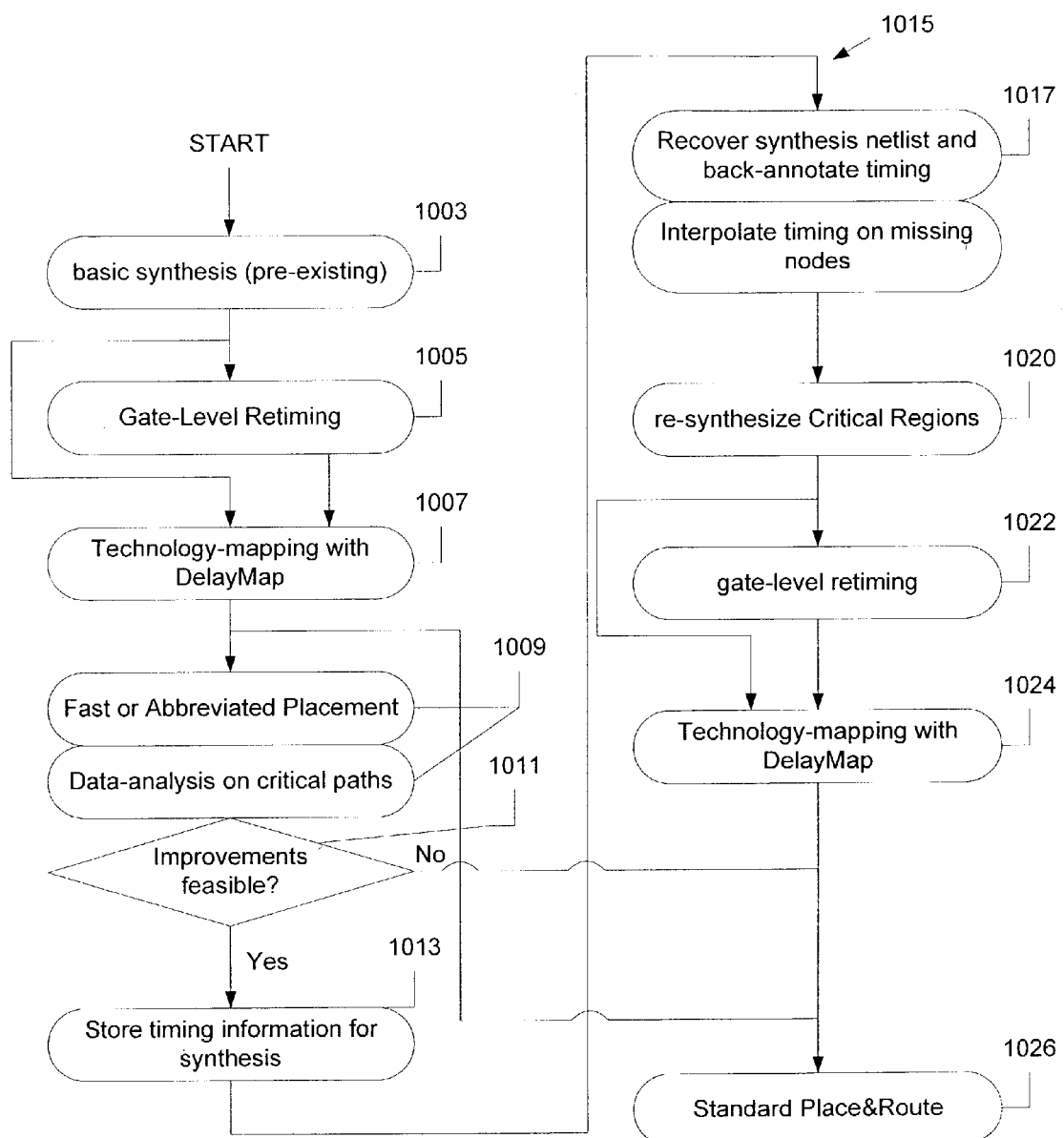
FIG. 10 shows another CAD flow with resynthesis.

FIG. 10 shows a flow diagram of a specific implementation of a physical resynthesis system of the invention. The system has a number of different parts. There is a flow to pass information (e.g., on physical routing delays) from the fitter back to synthesis, with the goal that synthesis will resynthesize the netlist to improve either performance (e.g., clock speed) or area (e.g., number of LCELLs) in the most appropriate manner. Whether the system optimizes performance over area or area over performance may be a user-selectable option. Besides performance and area, power consumption might also be optimized.

In a specific embodiment, the methods of resynthesis include a modified technology mapper "DelayMap," gate-level register retiming, alternative synthesis "scripts" and specific timing-driven algorithms such as Shannon decomposition of critical inputs. Retiming is discussed in greater detail in a copending U.S. Pat. No. 7,120,883, van Antwerpen et. al, "Register Retiming Technique," filed on May 27, 2003, which is incorporated by reference FIG. 10 includes the following steps:

1. Step 1003 is first-path synthesis using a generic synthesis script, which may include gate-level retiming (step 1005) in an embodiment. Examples of this include multilevel logic synthesis (MLS) or core synthesis, which are standard two-level and multilevel optimization of a gate-level netlist. Multilevel logic synthesis is a specific embodiment of synthesis, similar to Berkeley SIS in that the control over algorithms in multilevel logic synthesis is based on a script, which can be changed in experiments. A multilevel logic synthesis script can operate either on an entire netlist or, in the case of a hierarchical netlist, a subnetlist. Register retiming is optional at this point, and in an embodiment of the invention, register retiming is not performed at this point, but just before technology mapping, which is discussed later.

2. Step 1007 is a first-pass technology mapping using DelayMap, which is a specific implementation of a tech mapper as discussed above. Sample psuedocode is provided above.

3. Step 1009 is a partial fitting in the case where the placement algorithm is based on simulated annealing. Either truncated or accelerated scheduling can be used. Otherwise other methods to trade placement quality for speed can be used.

4. Step 1011 is a decision block in the fitter to determine whether enough information exists to resynthesize. If improvements are not feasible, the flow proceeds to a standard place and route, instead of performing a "resynthesis."

5. In step 1013, fitter stores timing information for nodes in a persistent database.

6. In a portion 1015 of the flow, flow control returns to synthesis. This is a second-pass synthesis (or a resynthesis) because basic synthesis was performed in step 1003.

7. In step 1017, synthesis reads and backannotates the timing information from the fitter on to individual synthesis cells.

8. Step 1017 may include dividing the netlist into delay-critical and area-critical portions. The delay-critical portions are resynthesized using a script optimized to improve delay, and the area-critical portions by a script optimized to improve area.

9. In step 1020, delay critical portions may be further optimized with specific algorithms such as Shannon decomposition on the most critical input.

10. Step 1022 performs gate-level register retiming, which may be performed on an entire netlist or portions of the netlist.

11. In step 1024, the netlist is remapped using DelayMap.

12. Second pass placement occurs, followed by routing in step 1026.

The above flow is an exemplary flow and specific embodiments of the invention may include any number of the steps of the flow, in any combination. There may be more steps or fewer steps than described. Further, two or more steps may be combined into a single step, or the steps performed in a different order than described. In an embodiment of the invention, it is not expected that all items in the described flow will be executed. Some flows would be: (a) gate level retiming is turned on, but there is no resynthesis; (b) no gate-level retiming on the first pass, but retiming in the subsequent pass; (c) fitter decides not to return to synthesis based on some metric such as analysis of delays (e.g., no improvement possible; see below for more information); (d) return from the fitter and do resynthesis of the critical regions, but don't retime after that; and (e) an iterative system with many passes (more than two passes), but a drawback may be a long compile time.

Below are some example of metrics on how to decide to abort (step 1101). Metrics that potentially influence the decision whether to abort or not (we might use only one, several, all, or none—we might just abort after a fixed number of iterations—of the below): (1) Length of most critical path (If there is only one combinational node in the most critical path, then only placement and/or routing is able to improve the speed. However, an area improvement is still possible.) (2) Distribution of length of the most critical paths (If the second most critical path contains only one combinational node, then we have the same situation as above.) (3) Total number of critical paths (If there are too many critical paths, then it is unlikely that we are able to improve all of them. In this case, we consider the netlist to be already optimized). (4) Number of paths in a certain range of criticality (If there are a lot of such paths, then it is likely that we degrade some of the relative critical ones, when we try to improve the most critical ones.) (5)

Part of the netlist that is considered being critical (Even if there are only a few paths that are critical, they might include a big part of the netlist. In this case it is also unlikely that we are able to optimize for speed.) (6) Part of the chip occupied by the netlist (If the chip is already 100 percent full, then we can probably improve for area, but probably not for speed. If the chip is only 3 percent full, then there is no reason to optimize for area, but we can probably optimize for speed.) (7) The timing information provided by the fitter does not converge towards a certain part of the netlist that is critical, i.e. the set containing the most critical paths varies significantly from one iteration to another. (8) All timing constraints are already met or exceeded by a certain amount or percentage and the netlist fits into the device. In this case, we might not want to spend more compile time for achieving extra performance and less area. (9) Types of cells on the most critical path (If there are only hard IP cells on the most critical path, then resynthesis cannot improve the speed.) (10) Based on total power consumption and areas of the placed netlists that are identified as hot-spots that might result in a chip failure. Other metrics are possible. The numbers given above are merely examples, and other numbers are possible.

Below are metrics that influence the decision when to abort. These are only examples of possible metrics. We could try several combinations of the above and decide based on experimental results which combination works best for a given architecture. Note, that the best combination of metrics as well as the optimal actual parameters probably vary from one target architecture to another): (1) m percent of the paths in the set of most critical paths are the same for the last n iterations and the total amount of cells in this set does not exceed k percent of the netlist. (2) The netlist occupies less than m percent of the device and all critical paths contain more than n combinational nodes that are all not hard IP blocks. More combinations are possible.

Figure 11:
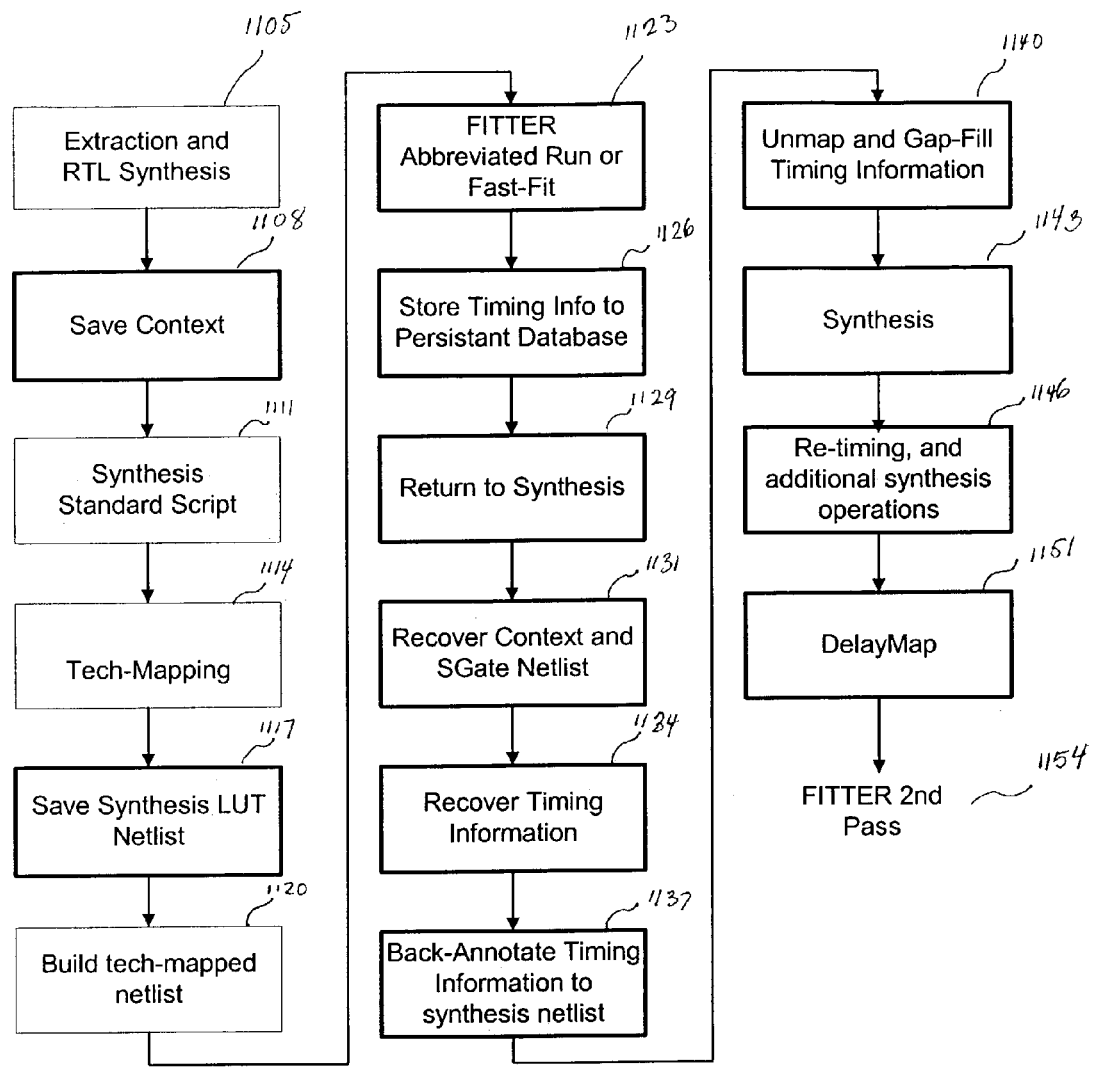
FIG. 11 shows a specific CAD flow implementation with resynthesis for programmable logic.

FIG. 11 shows a more detailed embodiment of a resynthesis flow of the invention. This flow is for a specific implementation of the invention for handling programmable logic integrated circuits of FPGAs. But the discussion of programmable logic in this application is merely an example of how the invention may be applied, and is not intended to limit the invention to such an integrated circuit. In other embodiments of the invention, the resynthesis flow may be used for other types of integrated circuits including microprocessors, memories, gate arrays, and ASICs, just to name a few types of integrated circuits. For those embodiments of the invention, some changes may be made to the flow, without departing from the principles of the invention.

In FIG. 11, the steps of the flow are extraction and RTL synthesis 1105, save context 1108, synthesis standard script 1111 (e.g., multilevel logic synthesis), tech-mapping to LUTs 1114 (e.g., DelayMap), save synthesis gate LUT netlist 1117, build tech-mapped netlist 1120 (e.g., atom building), fitter abbreviated run or fast fit 1123, store timing into database 1126, return to synthesis 1129, recover context and synthesis gate netlist 1131, recover timing information 1134, backannotate timing information to synthesis netlist 1137, unmap and gap-fill timing information 1140, synthesis 1143, retiming and additional synthesis operations 1146, DelayMap 1151, and then proceeds to fitter, second pass 1154. Atoms are the items handled by the physical design tools. Atom building refers to combining LUTs and DFFs to LCELLs.

The term "physical synthesis" refers to the use of physical (i.e., place and route) timing and congestion or area information, or both, in the logic synthesis process. This information can be obtained either by estimates or "quick-placement" efforts, or by iterating through the production placer and returning information.

For this invention, physical resynthesis refers to reentering a standard logic synthesis system (e.g., multilevel logic synthesis or tech mapping) with timing information from the fitter. Delay map is a specific embodiment of tech mapping, and any tech mapping approach may be used.

An important objective of physical synthesis is to use timing or other information from the fitter to generate an improved synthesis netlist in terms of performance and area. Secondary objectives include the balancing of resources (e.g., congestion, macrocell and memory or enhanced system block (ESB) usage, pin placement, global clocks, and so forth), which can be more appropriately assigned with physical information.

In the invention, physical resynthesis essentially consists of two phases or passes. In a first-pass through a compiler (such as in Quartus software, manufactured by Altera Corporation), a copy of the synthesis netlist is saved before entering the fitter, and timing information from the fitter is stored for later backannotation. Specifically, a technique of the invention (which may be embodied in a software package executing on a computer) will:

1. Create a flow for passing timing and other relevant information from fitter back to synthesis and tech mapping.

2. Determine the appropriate information to pass back, and when and how to do so.

3. Add decision-making facilities in the fitter to determine whether it is appropriate to do resynthesis.

In a subsequent pass, the netlist and timing information will be recovered and backannotation is performed. Then continue with any of a number of synthesis operations on the annotated netlist. Potential uses of timing information in the subsequent passes include the following (roughly presented in order of difficulty):

1. Do no synthesis operations, but allow the annotated netlist to proceed to technology mapping. The technology mapper can then use timing information to make more informed choices.

2. Execute gate-level retiming, using the timing information as a guide. Then execute some basic synthesis cleanup and proceed to technology mapping.

3. Identify-timing-critical regions of the netlist, and resynthesize them using an alternative timing-aggressive synthesis (which may or may not be script based). Similarly identify timing noncritical regions of the netlist and resynthesize using an alternative area-aggressive synthesis (which may or may not be script based). This process involves splitting off timing-critical or non-timing-critical portions of the netlist into hierarchies, which will be referred to as netlist surgery. For example, a netlist may have a hierarchy organized in such a way that the timing critical part is in one subnetlist of the hierarchy and the nontiming-critical part in another subnetlist and the neither-nor part in a third subnetlist. The hierarchy may have area critical portions in one hierarchy and delay or timing critical portions in another hierarchy.

4. Use synthesis algorithms that target the timing-critical portions of the netlist. For example, a critical signal may be identified, and Shannon decomposition or split high-fanout critical signals may be performed. An advantage of performing it at this point is the ability to perform standard synthesis optimizations on the resulting cofactors, while a disadvantage is that by distancing this step from the placement there is less faith in achieving a similar improved result.

5. Complete resynthesis with timing information on synthesis gate netlist, possibly including timing analysis within synthesis.

All items 1 to 4 can be done without adding timing knowledge to all algorithms in logic optimization, because a static (one-time) back-annotation of timing information suffices. To truly perform timing-driven logic optimization it involves making all algorithms able to modify and update timing as part of their work. The algorithms in synthesis, e.g., sweep, can appropriately modify timing information when deleting or adding new synthesis gates to the netlist in order to keep the netlist valid for timing analysis.

All items 1 to 4 can also be combined in the same flow, but the gains in quality of results may deteriorate as one attempts to successively reuse stale static timing information.

In other embodiments of the invention, these may include modifying existing core logic optimization algorithms for item 5. Also timing analysis may be performed using the synthesis netlist, either with back-annotated physical synthesis delays, or with approximate timing or wire-length models.

A synthesis gate netlist is a hybrid netlist of primitive gates and complex gates (higher-level objects like RAM and WYSIWYG atoms defined by third party tools). The synthesis netlist originally is produced after netlist extraction and elaboration, modified continuously through synthesis, and then converted to a synthesis netlist of look-up tables (LUTs) as part of technology mapping.

An atom is a node in a netlist which has been tech mapped. An atom may also be referred to as a logic element. An atom netlist is a technology-specific netlist of LEs, RAM, and I/O cells. Atoms may be family or product specific.

Physical synthesis is a relatively new research area of computer aided design (CAD) or electronic design automation (EDA).

Designs that should be particularly appropriate for a technique of the invention are those that are less optimized or tuned by the designer and run at slow to moderate performance initially. Designs that are already achieving top-end performance have been heavily pipelined to have very consistent critical paths, or which use large blocks of premapped intellectual property (IP) may improve, but are less likely to achieve the higher-end results. Designs with more global problems and many violating paths are more likely to be helped.

Atom building refers to the mapping of the synthesis gate netlist into the atom netlist (i.e., LUT+DFF, where DFF stands for D-type flip flop).

A compiler of the system, such as Quartus, refers to a complete synthesis, placement, routing, timing-analysis through assembler operation.

Resynthesis

The basic physical resynthesis flow for an embodiment of the invention, such as the Quartus compiler, is presented in FIG. 11. The purpose of this flow is to enable timing information to enter retiming and technology mapping, and more complicated flows.

Returning to FIG. 11, after netlist extraction (may be from any HDL such as VHDL, Verilog, or WYSIWYG, which is from a third party) and synthesis in step 1105, the technique, in step 1108, saves context before synthesis (step 1111) and the technology-mapped synthesis gate netlist in tech mapping (steps 1114 and 1117). An abbreviated fit (step 1123) gains timing information to store for resynthesis (step 1126), so on returning to synthesis (step 1129) the netlist is restored. The technique backannotates timing information (step 1137), unmaps the LUTs (or other technology specific mapping) to primitive gates (step 1140), executes retiming and subsequent synthesis cleanup scripts, then delay-based technology-mapping (step 1151), and continues to the final placement pass (step 1154).

In an embodiment of the invention, compared to a single pass synthesis approach, steps 1108, 1117, 1123, 1126, 1129, 1131, 1134, 1137, 1140, and 1151 facilitate a two-pass or multipass synthesis approach. In brief, below is a simplified description of a flow according to an approach of the invention.

1. Before beginning synthesis, save the "context" of the compile. This consists of items such as the compiler action point which are required to reenter synthesis later. This is represented in step 1108.

2. After the completion of synthesis and the generation of a synthesis gate LUT netlist in step 1117, at the point where an atom-level netlist is about to be created, save a copy of the netlist to the database for the subsequent pass. This step is done in both the unmapping and native flow.

3. Modify the fitter to perform either an abbreviated fit (step 1123), meaning either an aborted or a fast-fit placement. An aborted fit means to quit after a specified iteration k of placement steps or when some metric indicates that it is appropriate. Fast-fit refers to a fast run of place and route such as with an accelerated annealing schedule. This is the first pass through the synthesis flow and in this pass, a rough "estimate" of the final synthesis is performed by using an abbreviated fit routine. During a subsequent pass (e.g., second pass), a more detailed fit is performed.

4. Store slack, slack-ratio, and other relevant information from the fitter into the persistent database. This information refers to edges in the atom netlist. Slack information helps define the critical areas of the design which may be optimized.

5. Return to synthesis for the second pass (step 1129).

6. In the subsequent pass of synthesis, recover the previously saved context and synthesis gate netlist.

7. Recover the timing information from the database, in preparation for back-annotation.

8. Backannotate timing information to the saved synthesis gate netlist by matching those gates to the driver atom and the fanout (or destination) atoms of the edges.

9. Gap-fill any missed synthesis gate LUT (or other technology dependent structure) nodes in the netlist.

10. Unmap the LUT-based synthesis gate netlist (or WYSIWYG netlist, in the case of the third party unmapping flow) to primitive gates suitable for resynthesis, and interpolate timing information for the new gates based on the timing information contained on the LUT input and output ports.

11. Perform retiming using the annotated timing information, along with "cleanup" synthesis processing (e.g., sweep gates after retiming).

12. Proceed to technology mapping, which will also use the timing information.

Details of the above steps are discussed below.

In order to properly restart synthesis, the technique needs to save otherwise volatile information such as the compiler action point, hierarchy list, and other database entries. This is called from the resynthesis flow as part of synthesis preparation.

This operation involves the storage of the synthesis gate netlist into a persistent database before or during the first execution of synthesis or tech mapping so that it can be recovered after first-pass fitting. The synthesis gate netlist is written to a persistent database using pointers to the data-structure, and in a specific case the synthesis gate netlist, along with a database filename. In a specific embodiment, there is only one stored synthesis gate netlist, and this is hard-coded to a unique filename. In another specific embodiment, the technique supports multiple versions.

A goal of this operation is to snapshot the netlist so that the netlist may be restored seamlessly on the subsequent pass. The netlist from the tech mapping module may be stored, at the point where synthesis gates have been tech-mapped into LUTs (or other structures), but before they have been converted to atoms. This ensures that the synthesis gate netlist is as close as possible to the atom netlist, so that a high rate of coverage may be achieved when matching the netlist. In other embodiments, however, the netlist from other modules may be stored instead.

In order to ensure a unique netlist, the netlist may be flattened when physical synthesis is enabled. Therefore, in this specific embodiment, physical synthesis is not to be used in conjunction with hierarchical synthesis options. However, for another embodiment, the netlist is not flattened and the invention may be used in conjunction with hierarchical synthesis.

The call to a fitter timing information algorithm to store the synthesis gate netlist is just before the call to generate atoms. A goal of the first call to place and route is to gain enough visibility of the critical components of the netlist to enable resynthesis. For this purpose, an approximate fit will suffice.

There are several ways to accomplish this approximate fit. In the case of a simulated annealing-based placer, one may accelerate the annealing schedule (fast-fit or super-fast-fit), or use the standard schedule but execute a controlled abort (out of place and route) after either a set number of outer loops or when some metric indicates that it is appropriate to abort (e.g., the critical path is viewed as stable by our analysis). There are advantages to each approach.

For the aborted fit: If standard synthesis, tech mapping, and fitting are performed, then data-analysis may be used to decide whether or not to return for a subsequent pass. Some designs are more suited to physical resynthesis than others, so this approach of using data analysis would allow the technique to incur the additional compile time only when there is deemed to be a potential improvement. Those designs ill-suited for physical resynthesis will not see a compile-time penalty for zero reward.

More reliable information will likely be obtained from an accelerated annealing schedule for those cases where resynthesis is performed. Currently an embodiment of the invention (e.g., Quartus) has a fast-fit operation in the production software which accomplishes an approximately 50 percent reduction in compile time while achieving an accurate fmax prediction in the 10 percent range. This can be tuned further downwards as appropriate ("super-fast fit").

To accomplish the abort-fit option, a fitter timing algorithm is queried after each placement iteration. The fitter timing algorithm decides when to write out the timing information, and notifies place and route. In an embodiment where a simulated annealing-based placer is used, the following steps are performed:

1. Don't allow any further placement step. This corresponds to setting the annealing temperature to T=0.
2. Skip the final quench phase.
3. Skip sanity checks and feasibility evaluations to avoid doing a second placement iteration.
4. Skip routing, pass final sanity checks, and avoid doing multiple fitter runs.

Timing and Slack

This section describes timing information in place and route. Timing is important information transferred from the fitter to synthesis, so a good understanding of some of the details is important.

The timing analysis routine reads the user assignments to determine requirements of all types on the netlist. These can include global fmax, Tsu (set up time), Th (hold time), Tco (clock to output time), and Tpd (pin-to-pin delay), but also individual clock and point-to-point requirements. Exceptions such as unconstrained and multicycle paths (delay between two sequential, registered, or clocked elements that have a delay longer than one clock cycle) are also incorporated into constraints. Timing will provide node and edge delays.

If a signal is allowed to take multiple clock cycles for traversing a path from its start point to its end point, then this path is called a multicycle path.

In an embodiment, timing information is based primarily on slack. Slack on a path is defined as the most stringent constraint less the longest delay between the endpoints of the path. Slack is then instantiated on an edge by computing the worst (smallest) slack over any path involving that edge.

A path in a netlist is defined as a sequence of combinational nodes such as AND-gates or LUTs and interconnections (edges) between them that connect either a primary input or a sequential element (e.g., RAM, register) to either a primary output or another sequential element. Note, that there might be an external delay outside the chip. In this case, the primary input or output is not the endpoint of the path going through it and the slack takes this external delay into account.

Slack-ratio on an edge is the lowest slack to constraint ratio for all paths containing that edge. Note that this does not necessarily correspond to the slack to constraint ratio for the path with the least absolute slack. The timing routine returns to the caller a vector of all edges in the netlist, with their slack-ratio. From each of these edges, the caller can query the delay on the edge, the slack ratio, and the requirement and slack that generated that slack-ratio. Currently, in an implementation, these factors will comprise all timing information relevant for resynthesis.

Slack ratio is an attempt to introduce the notion of relative criticality to nets that have different timing constraints—e.g., a path with delay 8 nanoseconds and requirement 10 nanoseconds has a slack 2 nanoseconds (i.e., slack is given by requirement or constraint minus actual) and is "more critical" than a path with a delay of 2 nanoseconds and a requirement of 3 nanoseconds, even though it has larger slack. The first path above has a slack ratio of 0.2 and the second has a slack ratio of 0.33. Slack ratios is given by slack divided by requirement (i.e., 2/10 for the first path and 1/3 for the second). Note, however, that adding 1 nanosecond of delay to each path will change the relative ordering of slack ratios. This is because 1 nanosecond is more significant to the second path than the first path because of the absolute constraint. Similarly, adding or removing absolute delay from an edge can change which constraint and slack apply to it, which means that slack-ratios and timing information in general can rarely be recalculated as a local operation-consider the same example where the relevant edge is involved in both of these paths, and the relative ordering of the slack-ratios changes.

A further note on slack ratio that can be relevant to understand issues in timing visibility and algorithms that use timing information is that of relaxation. When the user specifies a complicated set of constraints our goal is to attack those paths that fail to meet their absolute requirement. However, for many users the requirements consist of only global fmax and Tsu or Tco requirements, even though there are multiple clock-domains in the design. In this case a default option is that the user wants to "optimize all paths" so the timing routine will independently normalize the requirement on each constraint type (clock domain or I/O constraint, referring to Tsu or Tco) so that its most critical path has slack 0 (never negative). This ensures that the technique continues to optimize paths for the best possible result when the requirement is easily achievable and also ensures that the technique attempts to optimize the path towards best-possible even when meeting the absolute requirement is hopeless. In the understanding of all algorithms it is important to distinguish between the normalization and nonnormalization cases.

The fitter module has preliminary data analysis routines to determine the "visibility" of critical path edges. The technique may also be able to dynamically control the end of the aborted fit to the point where there is sufficient information, where there is convergence in visibility, or in some cases do not return to synthesis when there are not sufficient possible gains.

By storing slack-ratio and other data for each node, for each outer loop, the following information may be calculated:

1. Rates of convergence and correlation between iteration i and the final slack-ratio vector.
2. Stability and convergence.
3. Rank correlation between nodes and their slack ratios.

The above are just some examples of items that may be calculated and other information may also be calculated.

A method for saving the data is as follows:

A TIMING_INFO element is created for each timing edge and stored together with all other timing info elements in a list of pointers to timing info elements. Each of these timing info elements contains the following:

1. The name of the atom corresponding to the timing edge's source.
2. The name of the atom corresponding to the timing edge's destination.
3. The slack/slack ratio/delay of the timing edge which is the slack/slack ratio/delay between the two atom edges.

Finally, the list of pointers to timing info elements is written to the persistent database using a function which takes any pointer and writes the memory segment related to this pointer to the persistent database. The information is retrieved just before backannotating the synthesis gate netlist by a call to another function.

The backannotation of the data is described separately. Backannotation is the process of matching up the timing information from place and route (in an embodiment, this is indexed by atom names, and in other embodiments other techniques may be used such as storing pointers from the atom nodes to the corresponding synthesis gates, using a table to look up corresponding synthesis gates, and others), to the previously stored synthesis gate netlist (in an embodiment, the netlist has synthesis gate node names). Since the original synthesis gate netlist was stored immediately before atom generation, these names mostly correspond. However, operations such as register packing and duplication or modifications in the carry-chain implementation, which can occur late in the fitter, modify the netlist and prohibit one to one correspondence. A more detailed complication is that once the LUT or other structure is unmapped into individual two-gates, the routine interpolates the timing information stored at the external ports of the atom to these internal gates which were not visible to the fitter.

Because one cannot guarantee one-to-one correspondence and do some interpolation, backannotation consists of both timing data and a confidence metric associated with the data.

For each timing edge recovered from the fitter, the goal is to match its source and destination nodes to a synthesis gate driving the edge and a synthesis gate that is the destination of the edge within the synthesis gate netlist.

1. First try to find the synthesis gate that corresponds to the atom driving the edge with the timing information (from_gate, see pseudocode in table E). If this synthesis gate can be found, try to find the synthesis gate that corresponds to the atom that is the destination of the edge containing the timing information (to_gate, see table E).

2. If no to_gate could be found, annotate all edges in from_gate having a lower confidence value than this annotation with the current timing information (slack, slack ratio, and delay). The confidence of this annotation is set to 100 percent/number of edges.

3. If to_gate could be found, try to identify all combinational paths from-gate to-gate. Annotate all edges on those paths with the timing information depending on the criticality, as well as the confidence, which depends on the number of parallel paths and the unit delay length of path including the edge.

4. If from_gate cannot be found, look for the synthesis gate that corresponds to the atom that is the destination of that edge (to_gate) containing the timing information. If a to_gate can be found, annotate all the edges terminating in to_gate (fanin) having a lower confidence value with the timing information and a confidence value of 100 percent/fanin. Otherwise, ignore this timing information.

In practice, the deviations between the netlist of synthesis LUT gates and the atom netlist is small, and the routine is able to correctly match about 95 percent to 100 percent of all edges.

Currently a significant amount of information is annotated to the synthesis gate netlist. To reduce the amount of memory used, this information may be condensed or unnecessary information may be eliminated. For example, confidence values are currently added. However, if it is desirable to reduce memory requirements, this information may be removed, especially if no algorithms will use this information.

Gap filling denotes the process of annotating those edges between synthesis gates with timing information that have not been annotated during the previous step (back annotation of timing information). This is done in the following way.

Go through all synthesis gate edges with a driver (including all synthesis gate edges that are IOs and don't have a driver). Put on a stack those edges with unsatisfactory labels. For each item on the stack:

1. Perform a depth first search (DFS) through the inputs of the driving synthesis gate node until all incoming edges of the current synthesis gate have timing information, or a clocked element or an input pin is reached.

2. Label the current edge with delay 0 as well as the minimum of all slack and slack ratio values on the edges on the driver's input edge, if any.

3. Continue until all edges encountered during this DFS are labeled (or at least have been handled).

The following issues are likely to exist after copying the timing information and the gap filling:

1. There may be some remaining edges that didn't get annotated. This might happen, for example, if the previous step parsed through the synthesis gate netlist and reached an input pin without getting timing information on all edges.

2. There are also some edges annotated by poor guesses, i.e., they have a very bad confidence value, because either the synthesis gate driver edge or the synthesis gate destination of an edge could not be found.

In an embodiment, gap-filling might be used for the basic flow. However, in other embodiment, other approaches may be used.

One of the processes performed as part of backannotating the netlist is to unmap the synthesis gate LUTs into primitive gates. In the case of the unmapping flow, these are WYSIWYGs. For the native flow, there is code to unmap LUTs into primitive gates based on the LUT-mask.

As part of both the WYSIWYG and native unmapping flow, timing information is interpolated and stored on the input and output ports of the LUTs to any internally generated gates. This is a relatively straightforward approach.

Further embodiments of the invention may include a number of algorithms to operate on a backannotated netlist. Some examples are Shannon decomposition of critical inputs and splitting of high-fanout nodes.

An operation consists of calling gate-level retiming with the backannotated delays, along with some cleanup operations (e.g., sweep duplicate FFs after re-timing).

The routine may additionally resynthesize timing critical regions using an alternative timing-aggressive multilevel logic synthesis script or timing noncritical regions of the netlist using an alternative area-aggressive multilevel logic synthesis script, or combinations of these approaches.

The DELAY-MAP technology mapper has the ability to take real timing information into account (rather than unit-delay as used in most technology mapping algorithms). Though some synthesis gates will have lost their information as part of the retiming process, and the netlist as a whole will have "stale" timing information, there will be gains simply because technology mapping has increased visibility of the critical path.

The primary user of fitter timing information may be multilevel logic synthesis or Delay-Map.

The goal for physical resynthesis is to fully backannotate timing and have the second pass of synthesis be fully timing aware. To maintain valid (even inaccurate) timing information would require that all algorithms in multilevel logic synthesis be able to generate valid timing information as they create and invalidate or destroy synthesis gate s, even if they are not timing-based algorithms.

An intermediate approach is to recognize that much of the improvement in synthesis can be achieved by distinguishing the portions of the netlist that are timing-critical versus those that are area-critical, performing netlist "surgery" to decompose the netlist into these subnetlists and then resynthesizing or remapping them independently.

The main components of this approach are the identification of critical regions, the different handling of timing critical versus nontiming critical parts of the netlist, e.g., through netlist surgery, and the identification or creation of different multilevel logic synthesis scripts or new algorithms for the different goals.

Depending on the implementation, it may not be sufficient to simply compute the induced subgraph over all synthesis gates with slack-ratio less than a certain threshold. The routine may also include some amount of neighboring logic in order to allow any resynthesis or remapping algorithms to operate.

There are a number of approaches to computing a critical region:

1. Starting with the critical edges as seed-nodes, perform a heuristic clustering-like algorithm, iteratively adding new nodes which are closely connected to the existing critical set until thresholds on size (e.g., 10 percent of the global netlist) or connectivity have been reached.

2. Start with the entire netlist and prune or delete non-critical nodes until a core of logic that contains the critical subgraph is reached.

Either approach may be used, or a combination of these may be used. In an embodiment, the first approach has been implemented. According to this approach, metrics such as Rent's Rule are used to achieve a good logic-to-IO ratio, in addition to using a hill-climbing approach to building the cluster.

Netlist surgery is described below. Given that there is an identified region of the netlist (i.e., set of nodes which comprise a critical region), the routine handles the timing critical part in a different way than the nontiming-critical part. In a first attempt, the timing critical part of the netlist is labeled "don't touch" and only the nontiming critical part of the netlist is unmapped and resynthesized with the objective of improving area. There should be a reduction in area with an approximately same to slightly worse timing for this approach. In a separate attempt, only the timing critical part of the netlist is unmapped and resynthesized. The result should be in this case an improved timing with a slightly worse area.

If both operations need to be executed in parallel, it may be necessary to split the netlist off into two or more separate netlists. This feature is referred to as netlist surgery. The items described below include the infrastructure for the decomposition of a given flat netlist into a hierarchy of subnetlists that are labeled as delay or area critical.

The goal of this item is to take a synthesis gate netlist and return a hierarchy of netlists with logical pins at the interface between them. This will be made as generic a utility as possible, so that it may be applied to a synthesis gate netlist as a generic synthesis operation independent of physical resynthesis.

Labeling of critical regions described in the previous section may or may not imply a contiguous and connected group of nodes, so a preprocessing step may be necessary before invoking netlist surgery to ensure that the labeled critical regions can be chopped from the original netlist as contiguous and connected pieces.

In an embodiment, the approach to this will involve creating a map between a synthesis gate and the group id of the subnetlist where this synthesis gate resides. This generic scheme allows the routine to create multiple cohesive subnetlists, each one being a contiguous and connected group of synthesis gates carved out of a top-level hierarchical netlist. Once the sub-netlist is labeled with its group id and has logical pins at its interface with the top-level netlist (output pins and input pins in the subnetlist are connected to corresponding input pins and output pins in the top-level netlist, respectively), the netlist surgery function will return the subnetlist corresponding to the group id or the group of synthesis gates specified.

The original flattened netlist, the set of newly created subnetlists, and the remaining top-level hierarchical netlist, all will be kept track of by a netlist manager, which is created within this subsystem, to keep the various netlists from cluttering the physical synthesis flow.

The primary work of netlist surgery is performed in the extraction phase. However, it is also possible to flatten the resulting hierarchy of subnetlists created by possibly repeated calls to netlist splitting after the conclusion of resynthesis.

The approach will be the reverse operation of the extraction of critical regions described above. A subnetlist, or a group of subnetlists each with its own distinct id, will be stitched back into the top-level hierarchical netlist from which it was originally removed, given the interface of logical pins between them: outputs from the subnetlist connected to their corresponding inputs in the top-level netlist and inputs from the subnetlist connected to their corresponding outputs in the top-level netlist. Upon completion of this step, there should be a single flattened netlist ready for fitting.

In an embodiment, the routine labels all LUTs that are not part of the critical region with "don't touch" such that only those LUTs being in critical regions are unmapped and remapped.

Given an identified timing-critical or timing noncritical region, the routine will handle the situation with multilevel logic synthesis scripts which aggressively target either delay or area as appropriate.

Synthesis processing in multilevel logic synthesis may consist of a set of internally generated and well-known industry algorithms for optimization of a gate-level netlist, controlled by a synthesis script. The synthesis script operates on the synthesis gate netlist, so different scripts may be executed on different netlist hierarchies.

An example of script-based logic synthesis is the following:

1. Minimize: ODC (observability don't care, which is a signal that cannot be observed on an output), duplicate logic removal, two-level minimization, XOR-extraction 2. Eliminate: remove structure by flattening 3. Minimize and restructure (pass 1): two-level minimize, factor, resynthesis, re-synthesis through fanout.

4. Minimize and restructure (pass 2): two-level-minimize, factor, resynthesis.

5. Remove shared logic: duplicate logic removal, extract common cubes, extract common XORs.

There are two versions of the script, distinguished by user logic-options—one that favors area, and one that favors delay. In both cases the default script may be chosen based on experimentation, i.e., the script that gives the best tradeoff for the given goal over a large range of benchmark circuits.

In a specific embodiment, the algorithms implemented in multilevel logic synthesis may not be timing-aware. Some are depth-aware, meaning that they consider combinational depth in their decision-making, but none would automatically use any slack or other data returned from the fitter. In other embodiments, the multilevel logic synthesis algorithms are timing-aware and would provide a performance improvement.

Multilevel logic synthesis scripts for specific regions is somewhat different than defining a global script for area or delay. A global script is hampered by "average" behavior on a large netlist, while a special-purpose script can directly target one optimization at the extreme cost of another—for example, permitting a very critical and small subnetlist to be reduced by two levels of delay at the cost of 4× area, or could exhibit extreme outliers. Furthermore, because one assumption is that there is a relatively small portion of the netlist, the routine may be more tolerant of extreme compile time behavior, especially in the timing-driven script applied to the critical path.

Regarding scripts, table G below provides a script that could be used on a small portion of the netlist, but not on the complete netlist due to reasons mentioned in the paragraph. Note that these algorithms have been discussed previously.

TABLE G

```
//
// Part 1: restructure by flattening & remove redundant logic
//
make sum-of-products
eliminate
eliminate
eliminate
sweep
make sum-of-products
two-level minimizer
sweep
remove redundant loop cuts
odc stuck feedbacks
sweep
odc stuck feedbacks
//
// Share duplicate logic and add structure
//
widen
remove duplicate logic
sweep
widen
decompose to two input gates
sweep
remove duplicate logic
remove duplicate registers
remove redundant loop cuts
```

In an embodiment, first, an alternative multilevel logic synthesis script optimizes delay at the possible large cost in area, and secondly another one optimizes area at a cost of delay. There are also the options of applying multiple scripts to the same subnetlist, scoring the results, and proceeding to fitting with the best option. Again, this is made possible by restricting the use of multiple-script sweeps to only small portions of the netlist.

One option is to modify technology mapping, independent of multilevel logic synthesis, for the timing-critical and area-critical portions of the netlist. Technology mapping based on chortle-crf provides a better area solution, albeit with worse delay results. The present invention may techmap with chortle, which may provide significant advantages to our area results in synthesis. For more information on chortle, see R. J. Francis, J. Rose, K. Chung: "Chortle: A Technology Mapping Program for Lookup Table-Based Field Programmable Gate Arrays", *In Proc. of the Design Automation Conference*, pp. 613-619, 1990 and R. J. Francis, J. Rose, Z. Vranesic: "Chortle-crf: Fast Technology Mapping for Lookup Table-Based FPGAs", *In Proc. of the Design Automation Conference*, pp. 227-233, 1991, which are incorporated by reference. Then, the critical regions are remapped with delay-based DELAY-MAP or CUT-MAP in the subsequent physical resynthesis phase. For more info on cut-map, see J. Cong, Y. Y. Hwang: "Simultaneous Depth and Area Minimization in LUT-Based FPGA Mapping", *In Proc. of the Int. Symposium on FPGAs*, pp. 68-74, 1995.

In a further implementation of the invention, an option is to provide an entire resynthesis of the netlist after backannotation. For this option, the existing nontiming-driven algorithms will maintain timing information. When considering complete resynthesis, timing analysis may also be done in synthesis itself. Since the timing information passed back from the fitter will quickly grow out of date as modifications are made to the netlist, it would be advantageous to make calls to timing analysis directly from synthesis. The technique may use either modifications or perturbations on the original timing netlist, or to experiment with traditional wire-length models.

In an embodiment, synthesis may use the timing analysis tool used in the fitter, and there will be operations to interact with this tool for annotating timing information. Wire-load models may be used to facilitate timing-driven synthesis before the physical resynthesis pass. As part of this process, synthesis gate LUTs may be unmapped earlier in the synthesis flow than described above. For example, the synthesis gate LUTs may be unmapped immediately upon entering the multilevel logic synthesis optimization script.

A further aspect of the invention is technology mapping (also may be referred to as DelayMap), shown as steps 1007 and 1024 in FIG. 10 and steps 1114 and 1151 in FIG. 11. Technology mapping maps logic into a particular integrated circuit. For example, a user provides a logic design. Technology mapping is used to map this logic into a programmable logic integrated circuit, PLD, or FPGA. The logic design is placed into the look-up tables (LUTs) of the FPGA. DelayMap is a speed-oriented technology mapper like FlowMap (see *IEEE Trans. On Computer-Aided Design*, vol. 13, no. 1, January 1994, pp. 1-12.). FlowMap is a depth-optimal LUT mapper based on unit-delay model. Unlike FlowMap, DelayMap uses the statistic cell-based delay model detailed below to model the signal delays through all types of gates as well as wires between gates. This enables DelayMap to map complex designs of heterogeneous types of gates (e.g., carry chains) and achieve best mapping solutions. The technology mapping technique of the invention is applicable to many classes of integrated circuits, including programmable logic as discussed in a specific embodiment above and also to ASICs and others.

Technology mapping maps into the cells, placement puts the cells into the integrated circuit, and routing connects the cells in the integrated circuit. This will then be physically implemented in an integrated circuit by programming or configuring it.

An aspect of technology mapping is to provide delays for the wires and cells are accurately modeled to obtain an accurate estimate of the performance of the design in the PLD or FPGA. Some techniques to model these delays include a (1) constant load unit delay model, (2) statistic wire load, and (3) statistic cell-based model. Technology mapping may be performed using any combination of these models.

In the constant load unit delay model, an amount of loading is applied at each node. For example, a connection or wire that is driving three NOR gates will have a certain load and delay. When there is more of a load at a particular connection (e.g., four NOR gates rather than three), the loading and delay will be greater.

In the wire load model, the delay through a net depends on its fanout load capacitance, which is often simplified to a function on the number of sinks of the net. One way to determine the function is to collect delay data in previous finished designs and draw a plot against the number of sinks of nets.

In the statistic cell-based model, for cell delay, for each logic or memory element, a fixed delay from the input pin to the output pin is given. The fixed delay may be provided for look-up in a table-based data structure. For each pair of source and destination elements, a wire delay is determined based on statistically observed values between the source and destination cells. The wire delay may also be provided by way of a look-up table data structure. However, in other embodiments of the invention, other types of data structures besides a look-up table may be used to store the data for the statistic cell-based model of technology mapping. For example, the data may be stored in a database or list.

Each path will have a delay that interleaves the wire and cell delay. For example, for a path that has two cells that are connected by a wire, the total delay of this path, or portion of the path if part of larger path, is the wire delay plus the delay of the two cells.

Tables H, I, J, and K below provide delays for specific type of connections and sources in a specific embodiment of the invention for programmable logic. For example, in table H, a MUX to IO, RAM, bus, or IOBUS will have a delay of G. Table K provides that G has a one nanosecond delay. The delay values provided below are merely for example and as will be understood by those of skill in the art, delays are technology dependent. For example, as integrated circuit continues to improve and devices become smaller and provide higher performance, the delays are expected to become smaller. Also, the technique of the invention uses statistics-based values, so these values may be adjusted to obtain more accurate estimates of the performance.

TABLE H

| SOURCE OF CONNECTIONS | IO RAM Bus IOBUF | DFF Latch | MUX | carry | sum | cascade |
|---|---|---|---|---|---|---|
| IO/RAM/Bus/IOBUF | G | G + Lu | G + Lu | G + Lc | G + Lu | G + Lu |
| DFF/Latch | G | Df + Lu | Df + Lu | 0 | 0 | 0 |
| MUX | G | 0 | 0 | 0 | 0 | 0 |
| Carry | G | C | C | C | C | C |
| Sum | G | 0 | 0 | S | S | S |
| Cascade | G | Ca + Lu | Ca + Lu | 0 | 0 | Ca |
| LCELL | G | 0 | 0 | 0 | 0 | 0 |
| Logics | G | Lw | 0 | 0 | 0 | 0 |
| cascade-LUT | G | Lw | 0 | 0 | 0 | 0 |
| LUT | G | 0 | 0 | 0 | 0 | 0 |
| wys lcell cascade | G | Ca + Lu | Ca + Lu | 0 | 0 | 0 |
| arith wys lcell carry | G | C + Lu | C + Lu | 0 | 0 | 0 |
| arith wys lcell output | G | S + Lu | S + Lu | 0 | 0 | 0 |
| normal wys lcell combout | G | Da + Lu | Da + Lu | 0 | 0 | 0 |
| normal wys lcell ragout | G | Df + Lu | Df + Lu | 0 | 0 | 0 |

TABLE H-continued

| SOURCE OF CONNECTIONS | IO RAM Bus IOBUF | DFF Latch | MUX | carry | sum | cascade |
|---|---|---|---|---|---|---|
| other wys output | G | Lw | Lw | 0 | 0 | 0 |

TABLE I

| SOURCE OF CONNECTIONS | LCELL | logics | casc-lut | LUT | wys lcell cascade | wys lcell carry |
|---|---|---|---|---|---|---|
| IO/RAM/Bus/IOBUF | G + Lu | G | G | G | G | G |
| DFF/Latch | Df + Lu | Df | 0 | Df | Df | Df |
| MUX | 0 | 0 | 0 | 0 | 0 | 0 |
| Carry | C | C | C | C | C | C |
| Sum | S | S | S | S | S | S |
| Cascade | Ca | Ca | Ca | Ca | Ca | Ca |
| LCELL | Da + Lu | Da | 0 | Da | Da | Da |
| Logics | Lw | Lw | 0 | Lw | Lw | Lw |
| cascade-LUT | Lw | Lw | 0 | Lw | Lw | Lw |
| LUT | 0 | Da | 0 | Da | Da | Da |
| wys lcell cascade | Ca + Lu | Ca | 0 | Ca | Ca | Ca |
| arith wys lcell carry | C + Lu | C | 0 | C | C | C |
| arith wys lcell output | S + Lu | S | 0 | S | S | S |
| normal wys lcell combout | Da + Lu | Da | 0 | Da | Da | Da |
| normal wys lcell ragout | Df + Lu | Df | 0 | Df | Df | Df |
| other wys output | Lw | Lw | 0 | Lw | Lw | Lw |

TABLE J

| SOURCE OF CONNECTIONS | wys lcell sum | normal wys lcell inputs | arithmetic wys lcell inputs | other wys |
|---|---|---|---|---|
| IO/RAM/Bus/IOBUF | G | G | G | G |
| DFF/Latch | Df | Df | Df | Df |
| MUX | 0 | 0 | 0 | 0 |
| Carry | C | C | C | C |
| Sum | S | S | S | S |
| Cascade | Ca | Ca | Ca | Ca |
| LCELL | Da | Da | Da | Da |
| Logics | Lw | Lw | Lw | Lw |
| cascade-LUT | Lw | Lw | Lw | Lw |
| LUT | Da | Da | Da | Da |
| wys lcell cascade | Ca | Ca | Ca | Ca |
| arith wys lcell carry | C | C | C | C |
| arith wys lcell output | S | S | S | S |
| normal wys lcell combout | Da | Da | Da | Da |
| normal wys lcell ragout | Df | Df | Df | Df |
| other wys output | Lw | Lw | Lw | Lw |

TABLE K

| Connections | Weighted Delay (nanoseconds) |
|---|---|
| G (global) | 1 |
| Lw (local) | 4 |
| C (carry wire) | 0 |
| S (sum wire) | 3 |
| Df (DFF wire) | 3 |
| Ca (cascade wire) | 0 |
| Da (data wire) | 1 |
| Lu (LUT) | 0.7 |
| Lc (LUT carry) | 0.6 |

Using the statistics cell-based approach, the technique of the invention is able to optimize the critical path and obtain better results compared to other approaches. For example, compared to the statistics cell-based approach, the unit delay model gives incorrect results for the critical path. It has been empirically observed that the statistics cell-based approach of the invention provides results that are about 5 percent faster. Those numbers are valid for an embodiment that applies certain target technology. Other improvements may be achieved for other embodiments or target technologies.

Figure 12:
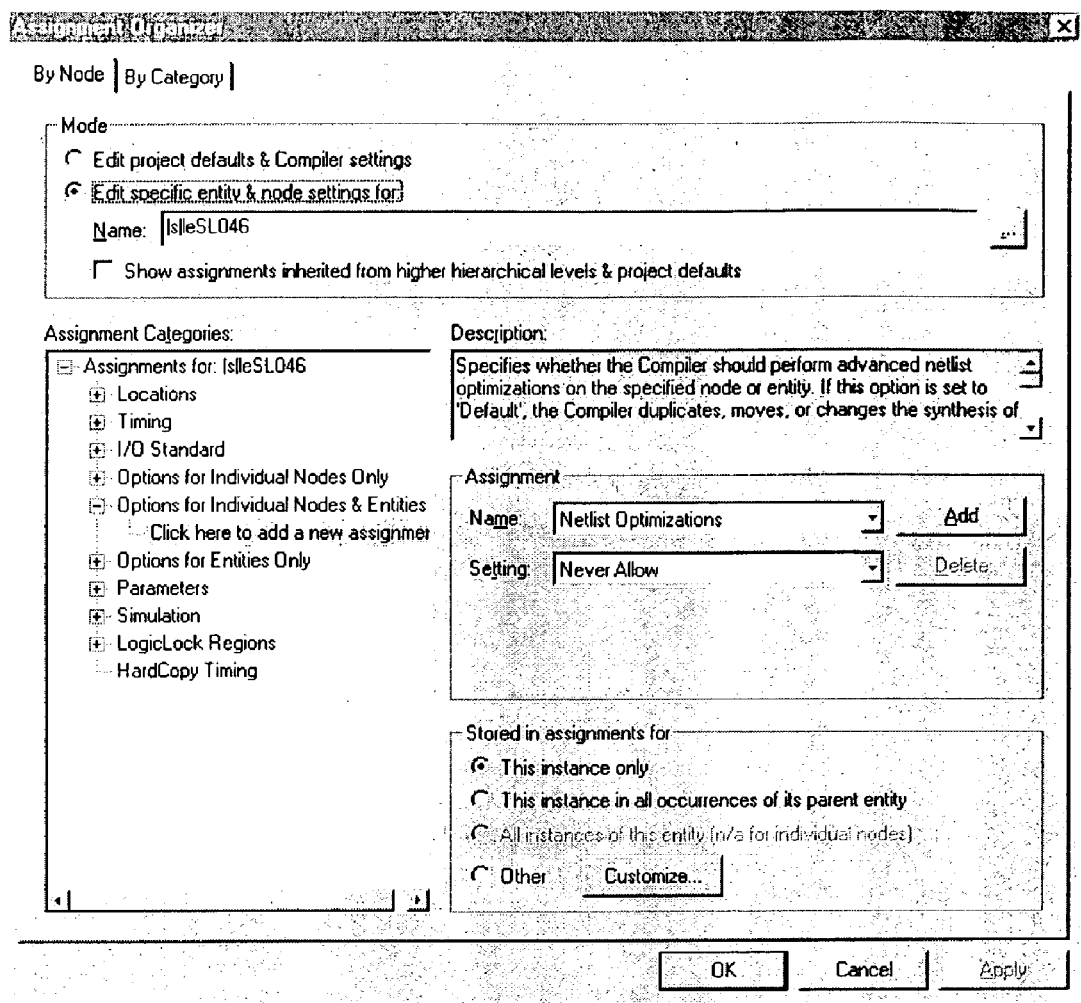
FIG. 12 shows a screen of a user interface having a "never allow" setting.

FIG. 12 shows an example of a user interface screen of a software implementation of the invention. This screen is from a specific embodiment of the invention, Quartus. In this interface, there is a "never allow" option to avoid or prevent optimizations on an entire design or portion of a design.

Figure 13:
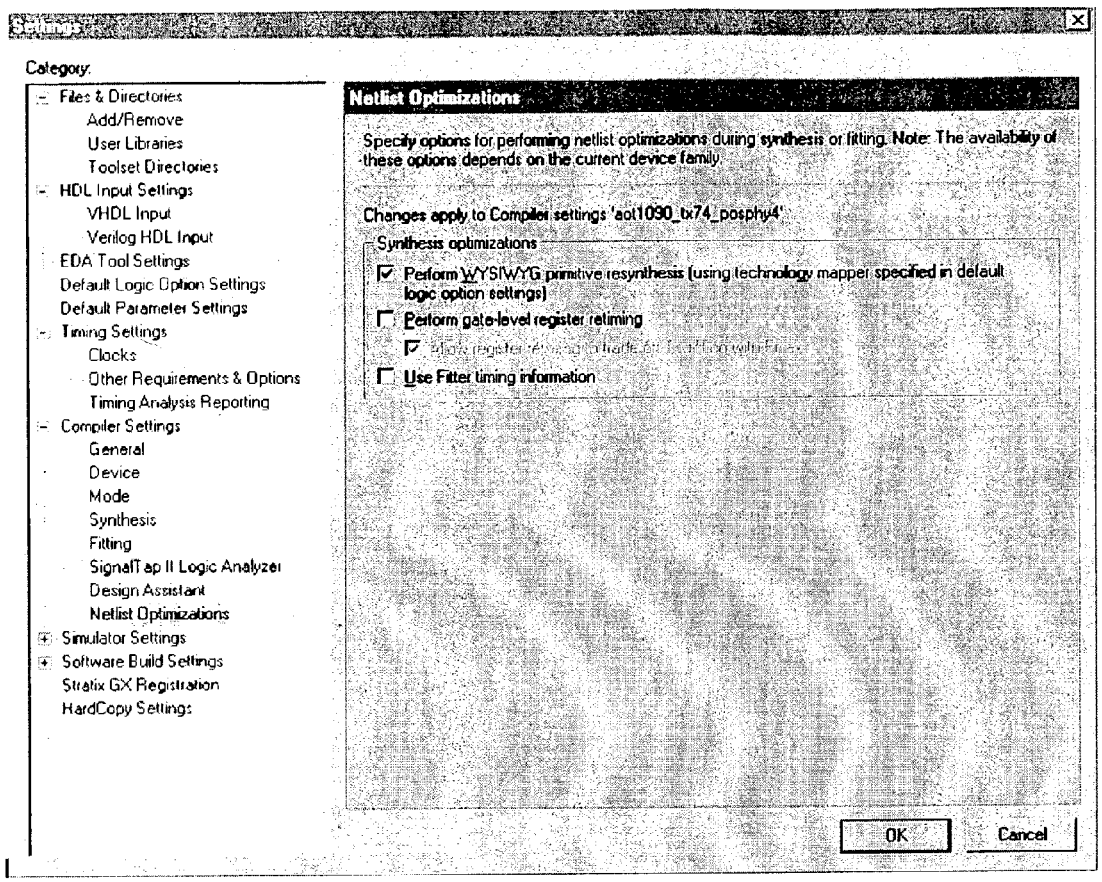
FIG. 13 shows a screen of a user interface of setting dialog for implementing resynthesis operations.

FIG. 13 shows an example of another user interface screen of a software implementation of the invention. This is a settings dialog for a CAD tool implementing resynthesis operations.

Figure 14:
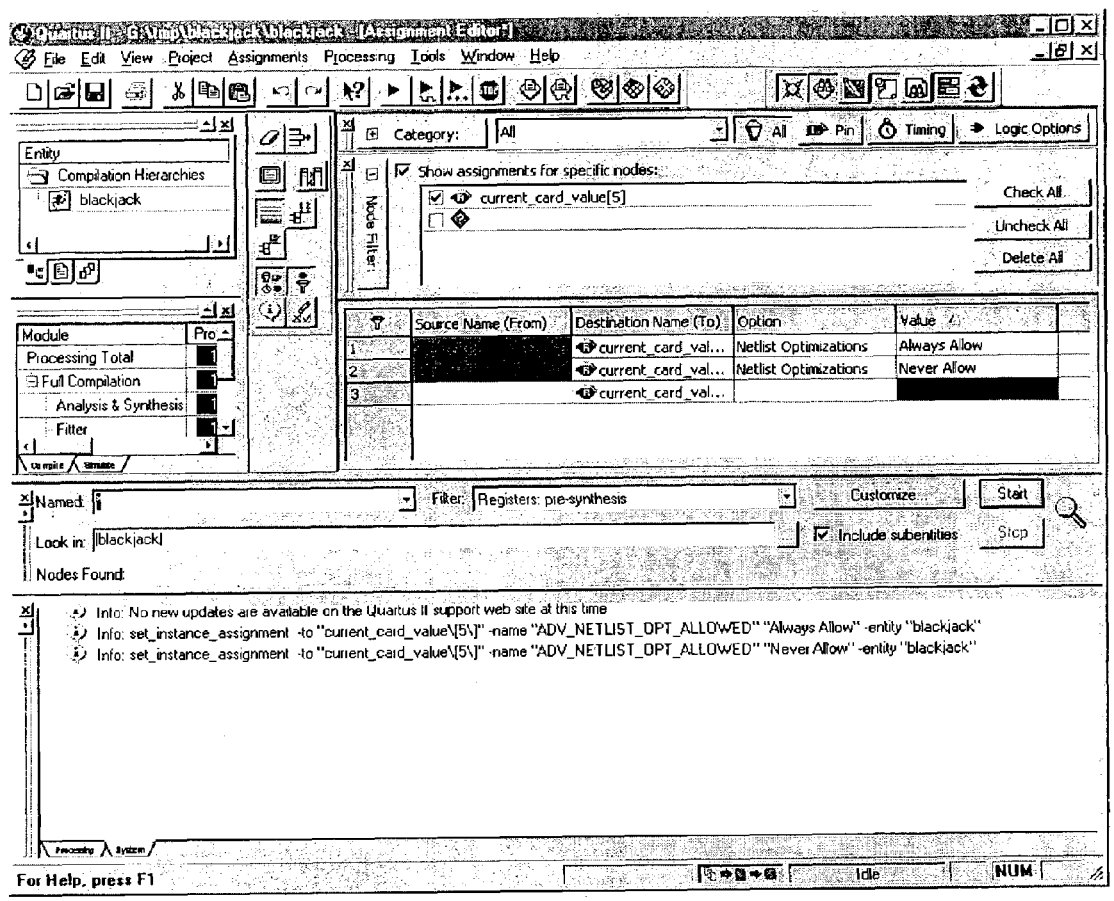
FIG. 14 shows a screen of a user interface of options for overriding defaults of not allowing netlist optimizations.

FIG. 14 shows an example of another user interface screen of a software implementation of the invention. This screen allows a user to specify logic options to (a) always allow netlist optimizations, which overrides a default which does not allow it, (b) forbid netlist optimizations, which overrides a default which does allow if for different nodes.

This description of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications. This description will enable others skilled in the art to best utilize and practice the invention in various embodiments and with various modifications as are suited to a particular use. The scope of the invention is defined by the following claims.

What is claimed is:

1. A method comprising:
    providing a high-level design language representation of an integrated circuit design;
    obtaining a first netlist for the integrated circuit design from a first synthesis tool;
    unmapping the first netlist to obtain a gate-level representation of the first netlist;
    resynthesizing the integrated circuit design using a second synthesis tool to generate a second netlist; and
    generating a final integrated circuit design using the second netlist, the final integrated circuit design to be used in producing an integrated circuit,
    wherein the resynthesizing step further includes:
        executing a partial fit against the gate-level representation of the first netlist to determine delays for the gate-level representation;
        executing a resynthesis of the partially-fit gate-level representation using the gate level representation from the first tool, the determined appropriate delays from the second tool, and a different synthesis algorithm than was used to generate the first netlist, and identifying portions of the gate-level representation as timing-critical portions or timing non-critical portions; and
        remapping the timing-critical portions of the resynthesized gate level representation with a bias toward timing improvements and concurrently remapping the timing non-critical portions with a bias toward area minimization to generate the second netlist, the second netlist being at least partially optimized for both performance and area requirements of the integrated circuit design.

2. The method of claim 1, further comprising:
    executing a first design synthesis process on the high-level design language representation of the integrated circuit design to obtain the first netlist.

3. The method of claim 1 wherein the first netlist comprises a look-up-table-based mapping of the integrated circuit design.

4. The method of claim 1, further comprising disallowing resynthesis for a portion of the first netlist assigned a "don't touch" indication.

5. The method of claim 4 wherein the portion of the first netlist assigned a "don't touch" indication comprises at least one of a look-up table or a logic gate.

6. The method of claim 1, further comprising:
    assigning a slack ratio to a path in the gate-level representation of the first netlist;
    if the slack ratio is above a critical value, performing an optimization on the path based on area; and
    if the slack ratio is below the critical value, performing an optimization on the path based on timing.

7. The method of claim 1 further comprising:
    adding a hierarchical structure to the second netlist.

8. The method of claim 2, further comprising:
    when executing the first design synthesis process, storing a plurality of variables into a database; and
    when executing the resynthesis, retrieving the plurality of variables from the database.

9. The method of claim 1, further comprising:
    performing a second fit process on the second netlist.

10. The method of claim 9, wherein the partial fit is an abbreviated version of the second fit process.

11. The method of claim 1, further comprising:
    performing a timing analysis to obtain estimates about timing information in the first netlist.

12. The method of claim 1, further comprising:
    performing timing analysis to obtain estimates about timing information in the second netlist.

13. The method of claim 12 wherein the timing information comprises slack or a slack ratio.

14. The method of claim 1 further comprising:
    performing a mapping of the second netlist to obtain a second netlist in a target technology.

15. The method of claim 1, wherein executing the resynthesis includes executing a retiming operation.

16. The method of claim 7 wherein the hierarchical structure comprises a hierarchy for timing-critical components.

17. The method of claim 7 wherein the hierarchical structure comprises a hierarchy for nontiming-critical components.

18. The method of claim 8, further comprising performing operations to match information from the first netlist to the second netlist.

19. The method of claim 18, further comprising performing a gap-filling operation to annotate parts of the second netlist that could not be matched.

20. The method of claim 18, further comprising performing an interpolation operation to annotate gates obtained by the unmapping.

21. The method of claim 10 wherein the first fit process differs from the second fit process by including an abort routine that aborts the first fit based on some metric.

22. The method of claim 21, wherein a metric determines it is not appropriate to execute the resynthesis, so the resynthesis and second fit are skipped.

23. The method of claim 1, wherein obtaining a first netlist includes a retiming operation.

24. The method of claim 1, wherein obtaining a first netlist for the integrated circuit design includes obtaining the first netlist from a third party.

25. A design resynthesis system, comprising:
a processor; and
a storage medium coupled with the processor and including instructions capable of being executed by the processor, the instructions when executed operable to:
receive a first netlist for an integrated circuit design from an external synthesis tool;
unmap a first netlist for an integrated circuit design to obtain a gate-level representation of the first netlist;
execute a partial fit against the gate-level representation of the first netlist to determine delays for the gate-level representation;
execute a resynthesis of the partially-fit gate-level representation using the gate level representation from the external synthesis tool, the determined appropriate delays from the design resynthesis system, and a different synthesis algorithm than was used to generate the first netlist, and identify portions of the gate-level representation as timing-critical portions or timing non-critical portions;
remap the timing-critical portions of the resynthesized gate level representation with a bias toward timing improvements and concurrently remapping the timing non-critical portions with a bias toward area minimization to generate the second netlist, the second netlist being at least partially optimized for both performance and area requirements of the integrated circuit design; and
generate a final integrated circuit design using the second netlist, the final integrated circuit design to be used in producing an integrated circuit.

26. The system of claim 25, wherein:
the storage medium further includes instructions that when executed are operable to execute a first design synthesis process on a high-level design language representation of the integrated circuit design to obtain the first netlist.

27. The system of claim 25 wherein the first netlist comprises a look-up-table-based mapping of the integrated circuit design.

28. The system of claim 25, wherein:
the storage medium further includes instructions that when executed are operable to:
assign a slack ratio to a path in the gate-level representation of the first netlist;
if the slack ratio is above a critical value, perform an optimization on the path based on area; and
if the slack ratio is below the critical value, perform an optimization on the path based on timing.

29. The system of claim 25, wherein:
the storage medium further includes instructions that when executed are operable to add a hierarchical structure to the second netlist.

30. A computer program product embedded in a computer readable medium for generating an integrated circuit design, comprising:
computer program code for providing a high-level design language representation of an integrated circuit design;
computer program code for obtaining a first netlist for the integrated circuit design from an external synthesis tool;
computer program code for unmapping the first netlist to obtain a gate-level representation of the first netlist;
computer program code for executing a partial fit against the gate-level representation of the first netlist to determine delays for the gate-level representation;
computer program code for executing a resynthesis of the partially-fit gate-level representation using the gate level representation from the external synthesis tool, the determined appropriate delays, and a different synthesis algorithm than was used to generate the first netlist, and identifying portions of the gate-level representation as timing-critical portions or timing non-critical portions; and
computer program code for remapping the timing-critical portions of the resynthesized gate level representation with a bias toward timing improvements and concurrently remapping the timing non-critical portions with a bias toward area minimization to generate the second netlist, the second netlist being at least partially optimized for both performance and area requirements of the integrated circuit design; and
computer program code for generating a final integrated circuit design using the second netlist, the final integrated circuit design to be used in producing an integrated circuit.

31. The computer program product of claim 30, further comprising:
computer program code for executing a first design synthesis process on the high-level design language representation of the integrated circuit design to obtain the first netlist.

32. The computer program product of claim 30, further comprising:
computer program code for disallowing resynthesis for a portion of the first netlist assigned a "don't touch" indication.

33. The computer program product of claim 30, further comprising:
computer program code for assigning a slack ratio to a path in the gate-level representation of the first netlist;
computer program code for performing an optimization on the path based on area if the slack ratio is above a critical value; and
computer program code for performing an optimization on the path based on timing if the slack ratio is below the critical value.

34. The computer program product of claim 30, further comprising:
computer program code for adding a hierarchical structure to the second netlist.

35. The computer program product of claim 30, further comprising:
computer program code for storing a plurality of variables into a database when executing the first design synthesis process; and
computer program code for retrieving the plurality of variables from the database when executing the resynthesis.

36. The computer program product of claim 30, further comprising:
computer program code for performing a second fit process on the second netlist.

37. The computer program product of claim 30, further comprising:

computer program code for performing a timing analysis to obtain estimates about timing information in the first netlist.

38. The computer program product of claim 30, further comprising:

computer program code for performing timing analysis to obtain estimates about timing information in the second netlist.

39. The computer program product of claim 30, further comprising:

computer program code for performing a mapping of the second netlist to obtain a second netlist in a target technology.

\* \* \* \* \*